(12) United States Patent
Yoshimura et al.

(10) Patent No.: US 8,738,347 B2
(45) Date of Patent: May 27, 2014

(54) METHOD FOR EXTRACTING IBIS SIMULATION MODEL

(76) Inventors: Tadaaki Yoshimura, Tokyo (JP); Yoji Nishio, Tokyo (JP); Sadahiro Nonoyama, Toyko (JP); Koji Matsuo, Tokyo (JP); Shinji Itano, Tokyo (JP); Yoshiyuki Yagami, Tokyo (JP)

( * ) Notice: Subject to any disclaimer, the term of this patent is extended or adjusted under 35 U.S.C. 154(b) by 304 days.

(21) Appl. No.: 13/354,109

(22) Filed: Jan. 19, 2012

(65) Prior Publication Data

US 2012/0191437 A1 Jul. 26, 2012

(30) Foreign Application Priority Data

Jan. 20, 2011 (JP) .................................. 2011-009995

(51) Int. Cl.
*G06F 17/50* (2006.01)
*G06F 3/06* (2006.01)
*G06F 5/06* (2006.01)
*G06F 5/16* (2006.01)
*G06F 7/78* (2006.01)
*G06F 9/54* (2006.01)
*G06F 13/16* (2006.01)

(52) U.S. Cl.
CPC ...... *G06F 3/0656* (2013.01); *G06F 2003/0691* (2013.01); *G06F 2205/063* (2013.01); *G06F 2205/062* (2013.01); *G06F 2205/066* (2013.01); *G06F 17/50* (2013.01); *G06F 5/06* (2013.01); *G06F 5/065* (2013.01); *G06F 5/16* (2013.01); *G06F 7/78* (2013.01); *G06F 9/544* (2013.01); *G06F 13/1673* (2013.01)
USPC .................................. 703/14; 703/13; 703/21

(58) Field of Classification Search
CPC ......... G06F 3/0656; G06F 5/06; G06F 5/065; G06F 5/16; G06F 7/78; G06F 9/544; G06F 13/1673; G06F 2003/0691; G06F 2205/062; G06F 2205/063; G06F 2205/066; G06F 2212/7203
USPC .......................... 703/13, 14, 15, 21; 716/109; 365/189.02; 702/120
See application file for complete search history.

(56) References Cited

U.S. PATENT DOCUMENTS

| | | |
|---|---|---|
| 6,292,766 B1* | 9/2001 | Mattos et al. .................... 703/14 |
| 8,286,110 B1* | 10/2012 | Kukal et al. .................... 716/109 |
| 8,452,582 B1* | 5/2013 | Al-Hawari et al. ............. 703/14 |
| 2004/0172605 A1* | 9/2004 | Kuge et al. ......................... 716/1 |
| 2006/0224374 A1* | 10/2006 | Kwon et al. ..................... 703/15 |
| 2007/0006104 A1* | 1/2007 | Kawata ............................. 716/4 |
| 2007/0081398 A1* | 4/2007 | Kotani et al. ............. 365/189.02 |

(Continued)

FOREIGN PATENT DOCUMENTS

JP 2007-219930 A 8/2007

*Primary Examiner* — Kandasamy Thangavelu
(74) *Attorney, Agent, or Firm* — Sughrue Mion, PLLC

(57) ABSTRACT

A method for extracting an accurate IBIS simulation model of a semiconductor device including a plurality of semiconductor chips comprises: extracting an AC characteristics model of a first output buffer in an IBIS simulation model by treating first and second output buffers of first and second semiconductor chips connected to a single external connection terminal as a transistor model and executing a transistor-level circuit simulation; calculating an output capacitance model of the first output buffer as an IBIS simulation model by adding output capacitances of the first and second output buffers as a transistor-level circuit simulation model; and synthesizing an IBIS simulation model of the first output buffer viewed from the external connection terminal by using the AC characteristics model and the output capacitance model.

18 Claims, 24 Drawing Sheets

(56) References Cited

U.S. PATENT DOCUMENTS

| | | | |
|---|---|---|---|
| 2007/0185699 A1* | 8/2007 | Suwa et al. | 703/13 |
| 2008/0040081 A1 | 2/2008 | Nishio et al. | |
| 2008/0066038 A1* | 3/2008 | Masumura | 716/9 |
| 2008/0244484 A1* | 10/2008 | Kumazaki | 716/5 |
| 2010/0031207 A1* | 2/2010 | Ohba | 716/4 |
| 2011/0093235 A1* | 4/2011 | Oh et al. | 702/120 |

* cited by examiner

1 SEMICONDUCTOR DEVICE

TRANSISTOR-LEVEL CIRCUIT SIMULATION MODEL

IBIS SIMULATION MODEL

RISING AND PULL-UP CONDITIONS

FALLING AND PULL-UP CONDITIONS

RISING AND PULL-DOWN CONDITIONS

FALLING AND PULL-DOWN CONDITIONS

IV CHARACTERISTICS

AC CHARACTERISTICS

OUTPUT CAPACITANCE

RISING AND PULL-UP CONDITIONS

FALLING AND PULL-UP CONDITIONS

RISING AND PULL-DOWN CONDITIONS

FALLING AND PULL-DOWN CONDITIONS

TRANSISTOR-LEVEL CIRCUIT SIMULATION CIRCUIT

IBIS SIMULATION CIRCUIT

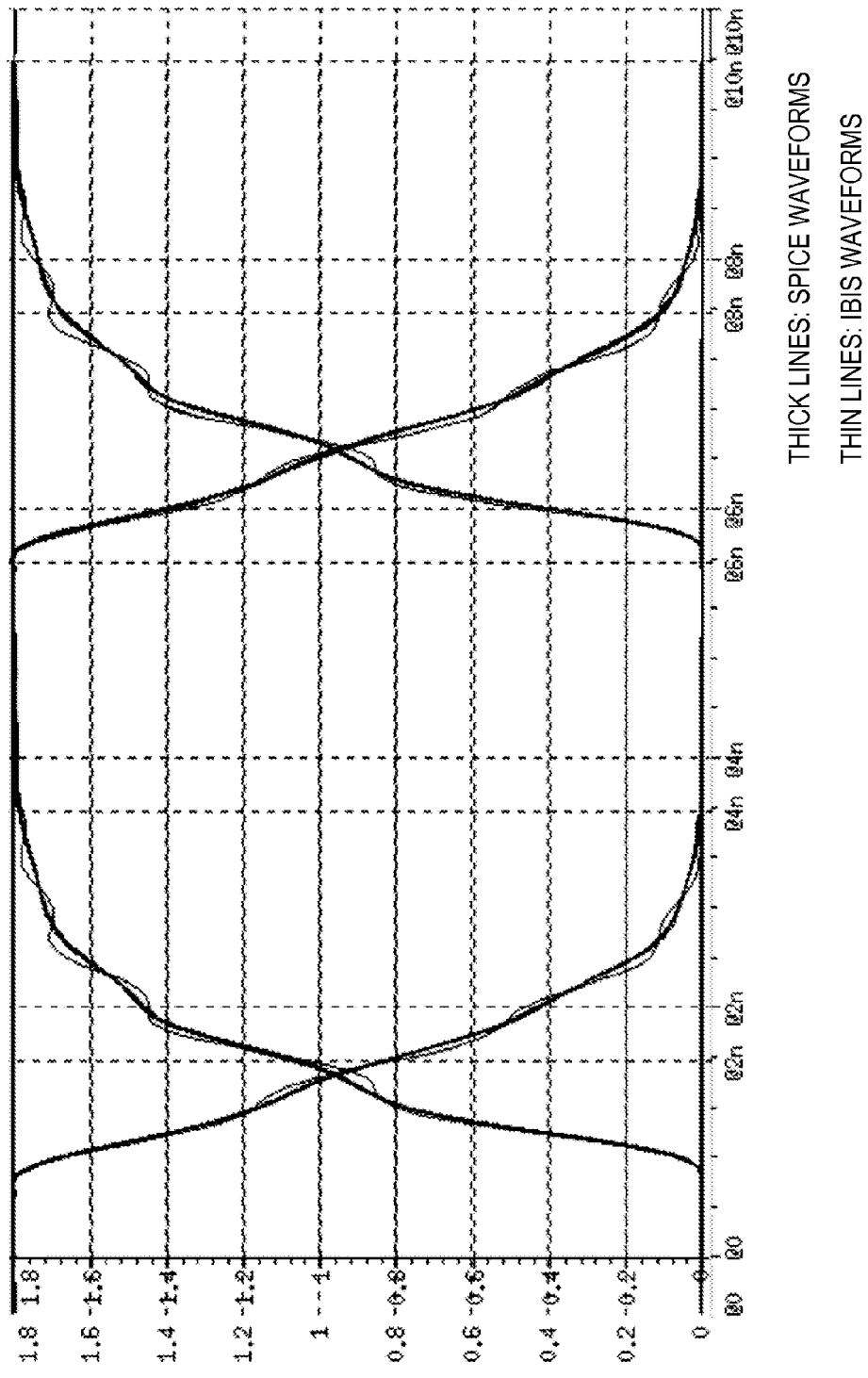

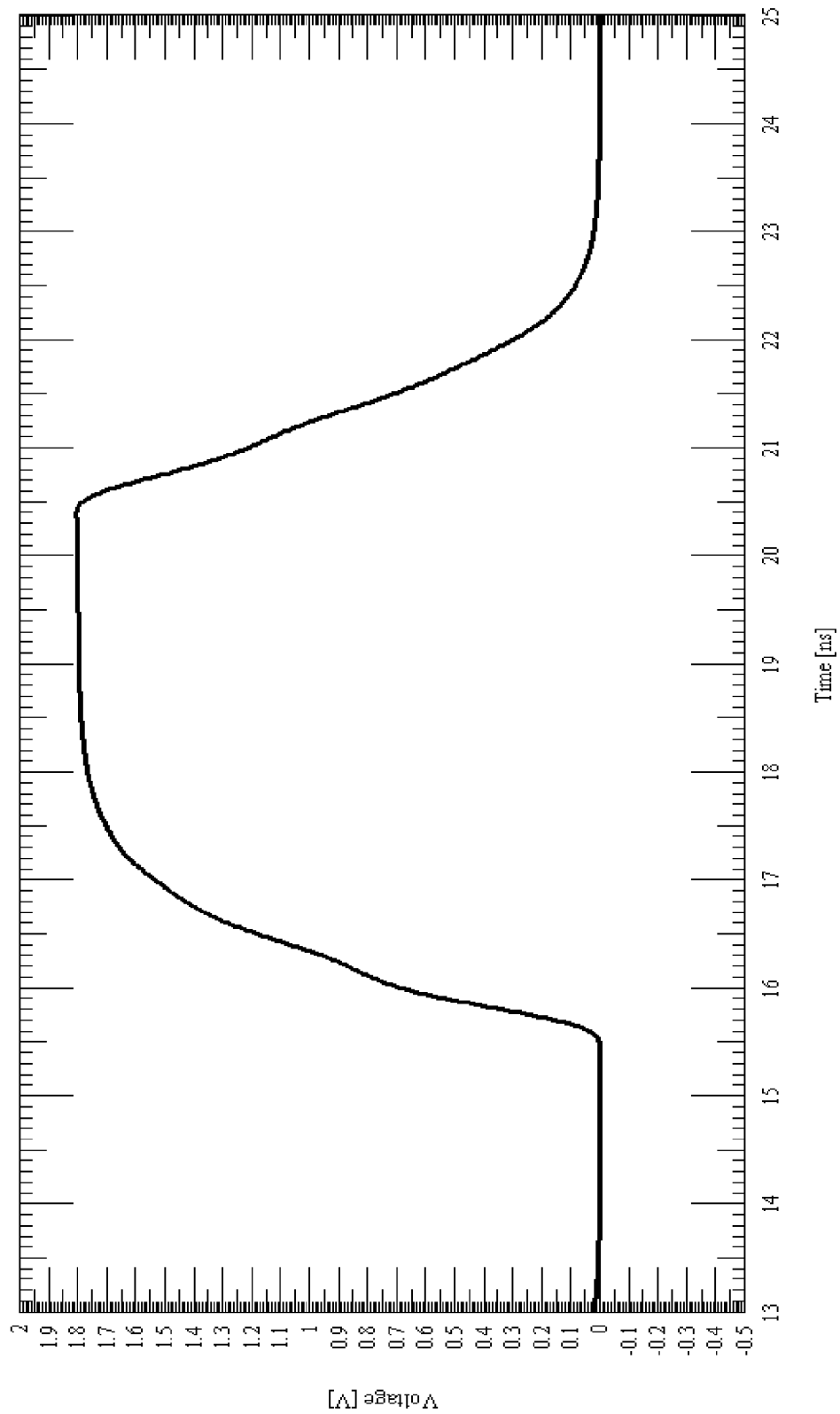

FIG. 13 RESULTS OF IBIS SIMULATION USING TOOL C (EXAMPLE 1)

RESULTS OF REFERENCE SPICE SIMULATION

Comparative Example  iobuf_1 HALF   SPICE Result

Cref= 7.5pf, Minimum Analysis Accuracy=10ps

RESULTS OF IBIS SIMULATION ACCORDING TO COMPARATIVE EXAMPLE

FIG. 20A

```
[Rising Waveform]
|iobuf_1 Rising-High Example_1
|Wed Aug 18 12:36:25 2010
|
R_fixture = 50.00
V_fixture = 1.800
V_fixture_min = 1.700
V_fixture_max = 1.950
C_fixture = 0.00pF
|
|Time          V(typ)   V(min)   V(max)
0.0000e+00s    1.045    1.170    0.906
1.4600e-10s    1.045    1.170    0.906
1.5600e-10s    1.045    1.171    0.906
   ⁓             ⁓        ⁓        ⁓
5.6600e-10s    1.519    1.353    1.800
5.8600e-10s    1.552    1.377    1.819
6.0600e-10s    1.581    1.400    1.835
6.2600e-10s    1.606    1.422    1.849
6.4600e-10s    1.629    1.444    1.860
   ⁓             ⁓        ⁓        ⁓
2.1860e-09s    1.800    1.699    1.950
2.2210e-09s    1.800    1.700    1.950
3.5000e-09s    1.800    1.700    1.950
|End iobuf_1 Rising-High
```

V-TIME TABLE MODEL (EXAMPLE 1)

FIG. 20B

```
[Rising Waveform]
|iobuf_1 Rising-High Comparative_Example
|Thu Aug  5 11:09:46 2010
|
R_fixture = 50.00
V_fixture = 1.800
V_fixture_min = 1.700
V_fixture_max = 1.950
C_fixture = 0.00pF
|
|Time          V(typ)   V(min)   V(max)
0.0000e+00s    1.045    1.170    0.906
1.0700e-10s    1.045    1.170    0.906
1.2700e-10s    1.045    1.171    0.906
   ⁓             ⁓        ⁓        ⁓
5.8700e-10s    1.700    1.490    1.912
5.9700e-10s    1.709    1.503    1.915
6.0700e-10s    1.717    1.516    1.917
6.1700e-10s    1.724    1.529    1.919
6.2700e-10s    1.731    1.540    1.921
   ⁓             ⁓        ⁓        ⁓
1.6270e-09s    1.800    1.699    1.950
1.7180e-09s    1.800    1.700    1.950
3.0000e-09s    1.800    1.700    1.950
|End iobuf_1 Rising-High
```

V-TIME TABLE MODEL (COMPARATIVE EXAMPLE)

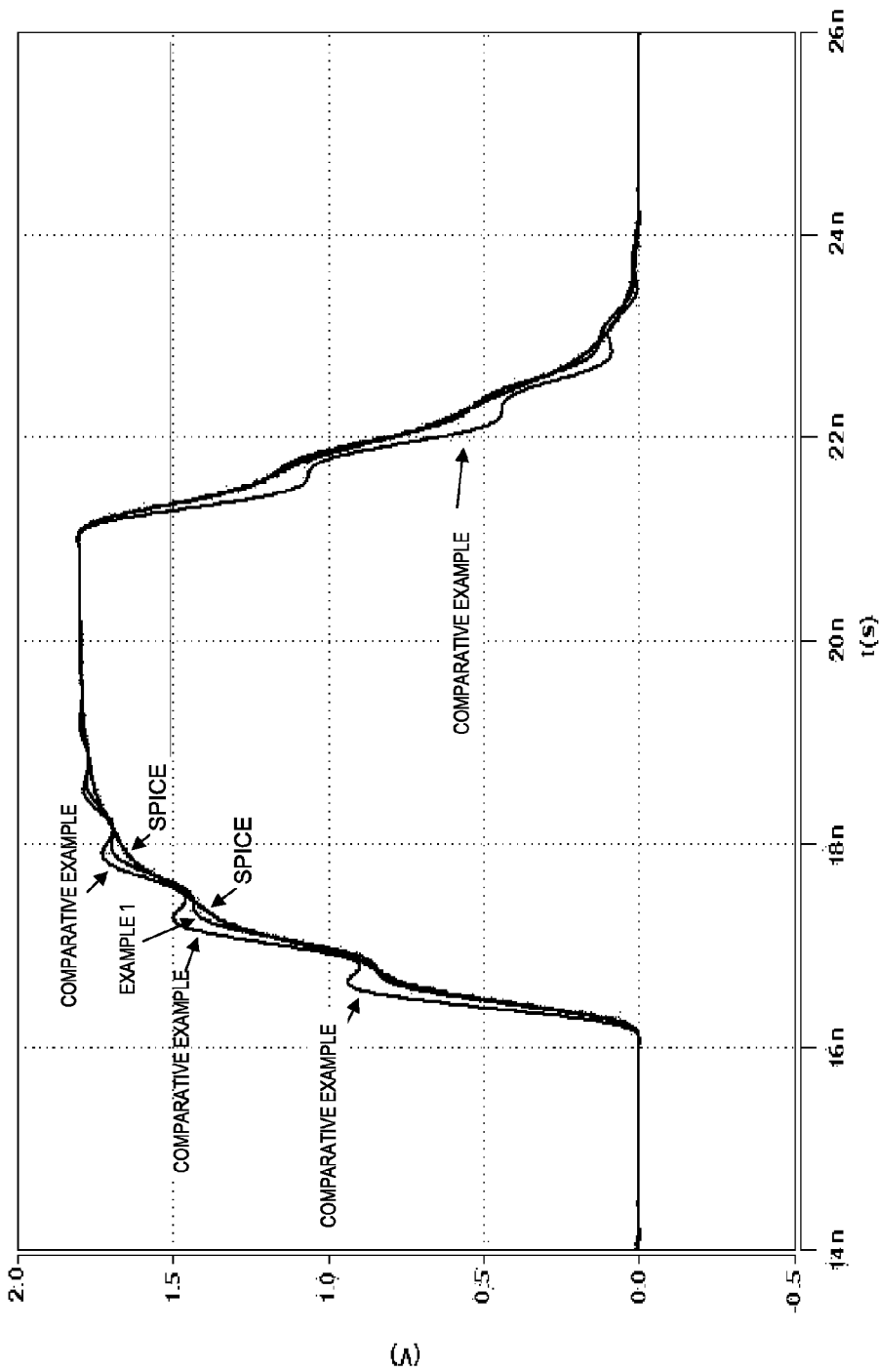

METHOD FOR EXTRACTING IBIS SIMULATION MODEL

TECHNICAL FIELD

REFERENCE TO RELATED APPLICATION

This application is based upon and claims the benefit of the priority of Japanese patent application No. 2011-009995, filed on Jan. 20, 2011, the disclosure of which is incorporated herein in its entirety by reference thereto. The present invention relates to a method for extracting an IBIS simulation model. In particular, it relates to a method for extracting an IBIS simulation model of a semiconductor device including a plurality of semiconductor chips each having an output buffer connected to a common external connection terminal.

BACKGROUND

As the operation speed of semiconductor integrated circuits or systems including semiconductor integrated circuits increases, it is becoming increasingly important to execute a simulation assuming that semiconductor integrated circuits are mounted on a printed board. In order for a customer (a system manufacturer) to execute such simulation assuming that various semiconductor integrated circuits provided by a plurality of semiconductor device manufacturers are mounted on a common printed board of the customer, a common simulation model is required. For this reason, an I/O buffer information specification (IBIS) model that models package electric characteristics and I/O characteristics of an integrated circuit is internationally standardized (EIA-656-B). Semiconductor device manufacturers providing various semiconductor integrated circuits provide an IBIS model for each of their semiconductor integrated circuits. System manufacturers embedding these semiconductor integrated circuits in a mount board or in a system use these IBIS models provided by the semiconductor device manufacturers. Namely, system manufacturers can execute an IBIS simulation on a mount board or a system on which various semiconductor integrated circuits are mounted.

As transistor-level simulators used for semiconductor integrated circuits, a simulation program with integrated circuit emphasis (SPICE) and SPICE-derived simulators are widely used. In contrast to such transistor-level simulation, an IBIS model treats an I/O buffer connected to an external connection terminal of a semiconductor integrated circuit as a single function, irrespective of circuit configurations or transistor characteristics in the semiconductor integrated circuit. Thus, an IBIS model enables a high-speed simulation. It is said that a simulation based on an IBIS model is ten times faster than a transistor-level simulation based on a SPICE model.

In addition, for semiconductor device manufacturers providing semiconductor integrated circuits, provision of IBIS models is convenient. Since the manufacturers can provide system manufacturers with information necessary for designing mount boards or systems, without disclosing information (trade secret) about the inside of semiconductor integrated circuits, such as characteristics of transistors and detailed configurations of internal circuits.

Thus, manufacturers providing semiconductor integrated circuits, namely, semiconductor integrated circuit suppliers, use transistor-level circuit simulators such as SPICE and simulate AC and DC characteristics of I/O buffers connected to an external I/O terminal of a semiconductor integrated circuit. These suppliers convert these I/O buffer characteristics into an IBIS model and disclose the IBIS model.

Patent Document 1 discloses a method of causing an information processing apparatus to execute an IBIS-description simulation relating to input/output characteristics of a stacked package, in which a plurality of semiconductor chips are stacked. According to Patent Document 1, on-die termination (ODT) values and output buffer device strength values that can be selected per chip are included in advance in a common IBIS description. According to Patent Document 1, users can use a simple method to modify the IBIS description to obtain an IBIS description for a combination of ODT and device strength. In addition, Patent Document 1 discloses that paths from an external connection terminal of the stacked package to the individual chips are written in electrical board description (EBD).

Patent Document 1:
Japanese Patent Kokai Publication No. JP2007-219930A, which corresponds to US2008/040081A1

SUMMARY

The entire disclosure of the above mentioned Patent Document is incorporated herein by reference thereto. The following analyses are given by the present invention. If a single semiconductor device includes a plurality of semiconductor chips and if a plurality of output buffers, each included in one of the plurality of semiconductor chips, are connected to a common external connection terminal (a single external terminal of the semiconductor device), such as one described in Patent Document 1, problems are caused. These problems are not caused when an IBIS model of a general semiconductor device is extracted, that is, when a single package includes only one semiconductor chip. Therefore, there is a need in the art to provide a simple method for extracting an accurate IBIS simulation model of a semiconductor device including a plurality of semiconductor chips.

According to a first aspect of the present invention, there is provided a method for extracting an IBIS simulation model of a semiconductor device that comprises a first semiconductor chip including a first output buffer having an output node connected to a first pad and a second semiconductor chip including a second output buffer having an output node connected to a second pad, wherein the first and second pads are connected to a single external connection terminal, one of the first and second output buffers is controlled to be active, and the other is controlled to be inactive. The method comprises: extracting an AC characteristics model of the first output buffer in an IBIS simulation model by executing a transistor-level circuit simulation using a net list that includes output transistors of the first and second output buffers; calculating an output capacitance model of the first output buffer in the IBIS simulation model by adding output capacitances of the first and second output buffers of the net list together; and synthesizing an IBIS simulation model of the first output buffer viewed from the external connection terminal by using the AC characteristics model and the output capacitance model of the first output buffer.

According to a second aspect of the present invention, there is provided a method for extracting an IBIS simulation model of a semiconductor device. The semiconductor device comprises an external connection terminal and n, where n is an integer of two or more, semiconductor chips, each including an output buffer having an output node connected to the external connection terminal, wherein one of the n output buffers connected to the external connection terminal is controlled to be active, and the other (n−1) output buffers are controlled to remain inactive. The method comprises: extracting an AC characteristics model of the one output buffer in an IBIS simulation model by executing a transistor-level circuit simulation using a net list that comprises information about the n output buffers connected to the external connection terminal and controlled to be active and inactive; calculating an output capacitance model of the one output buffer in the IBIS simulation model by adding output capacitances of the n output buffers of the net list; and synthesizing an IBIS simulation model of the one output buffer viewed from the external connection terminal by using the AC characteristics model and the output capacitance model.

The present invention provides the following advantage, but not restricted thereto. According to each of the aspects of the present invention, even when a semiconductor device includes a plurality of semiconductor chips having output buffers connected to a single external connection terminal, extraction of an IBIS simulation model can be made as accurately as extraction of characteristics of a transistor-level circuit simulation model.

BRIEF DESCRIPTION OF THE DRAWINGS

FIG. 5A illustrates a model based on a transistor-level circuit simulation and FIG. 5B illustrates a model based on an IBIS simulation.

FIGS. 6A to 6D illustrate rising and pull-up conditions; falling and pull-up conditions; rising and pull-down conditions; and falling and pull-up conditions, respectively.

FIGS. 8A to 8D are extraction circuit diagrams illustrating rising and pull-up conditions; falling and pull-up conditions; rising and pull-down conditions; and falling and pull-down conditions, respectively.

FIG. 9A is a circuit diagram for a transistor-level circuit simulation and FIG. 9B is a circuit diagram for an IBIS simulation.

FIG. 10 is a graph in which results of a simulation using the circuit in FIG. 9B and an IBIS model extracted according to example 1 are overlaid with results of a reference transistor-level circuit simulation using the circuit in FIG. 9B.

FIG. 11 illustrates results of a simulation using the same IBIS model extracted according to example 1 as used in FIG. 10 and using an IBIS simulation tool different from that used in FIG. 10.

FIG. 12 is a graph in which FIG. 11 is overlaid with the results of the reference transistor-level circuit simulation.

FIG. 14 is a graph in which FIG. 13 is overlaid with the results of the reference transistor-level circuit simulation.

FIG. 16A illustrates results of the reference transistor-level circuit simulation using the circuit in FIG. 9A; and FIG. 16B illustrates results of a simulation using the circuit in FIG. 9B and using an IBIS model extracted according to a comparative example.

FIGS. 20A and 20B illustrate V-time tables (AC characteristics) extracted according to example 1 and the comparative example, respectively.

FIG. 21 is a graph in which the results of the simulations using the IBIS models extracted according to example 1 and the comparative example are overlaid with the results of the reference transistor-level circuit simulation.

PREFERRED MODES

Figure 1:
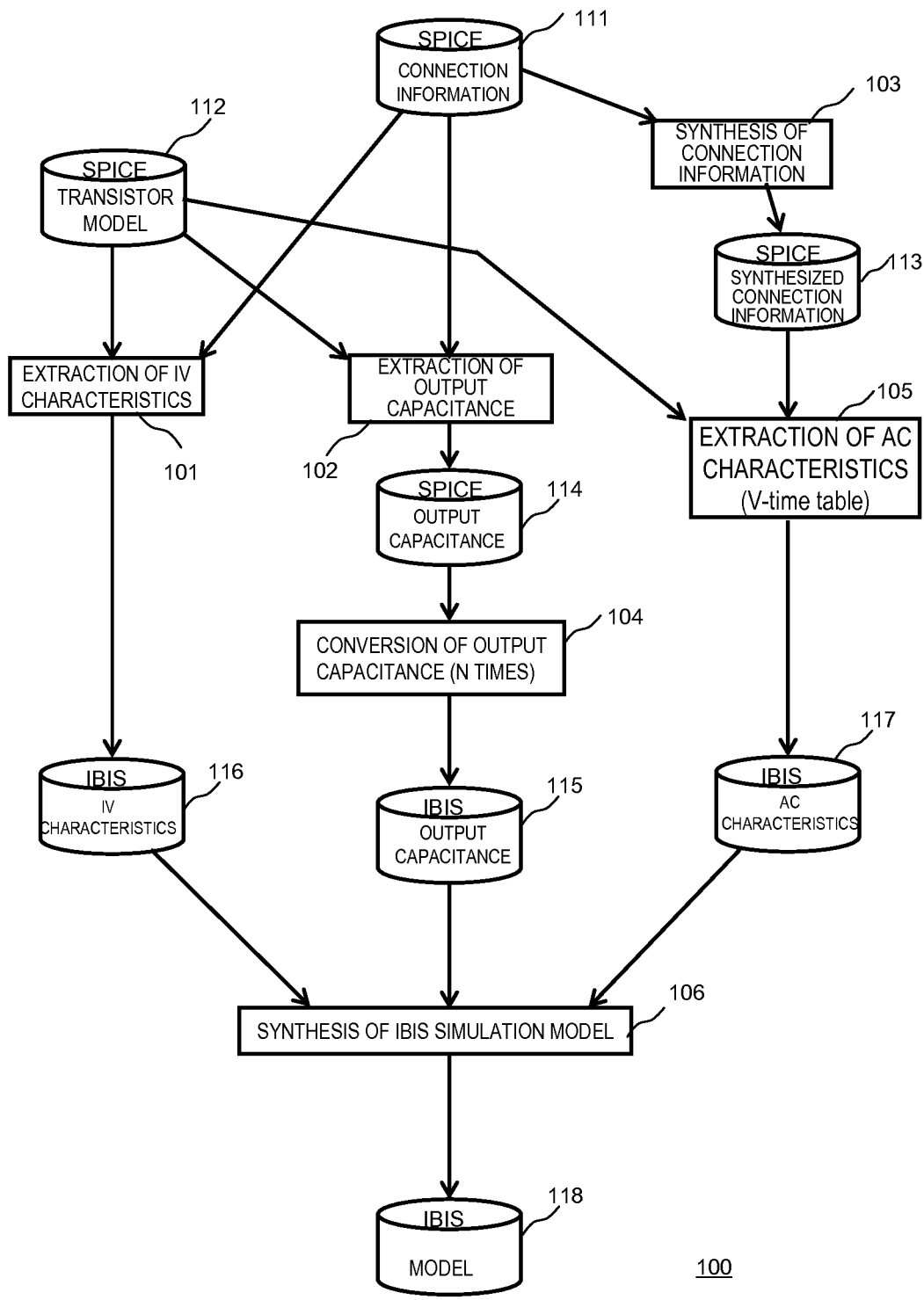
FIG. 1 is a flow chart illustrating a data/process flow of an IBIS simulation model extraction method according to a first exemplary embodiment.

In the present disclosure, there are various possible modes, which include the following, but not restricted thereto. Needless to say, what is claimed by the present application is stated in "WHAT IS CLAIMED IS:" of the present application. Namely, what is claimed by the present application is not limited to the following technical concept. In addition, while the present invention will be hereinafter summarized with drawings and reference characters, these drawings and reference characters will be used merely as examples to facilitate comprehension. Namely, the drawings and reference characters do not limit the present invention to the illustrated modes.

Figure 2:
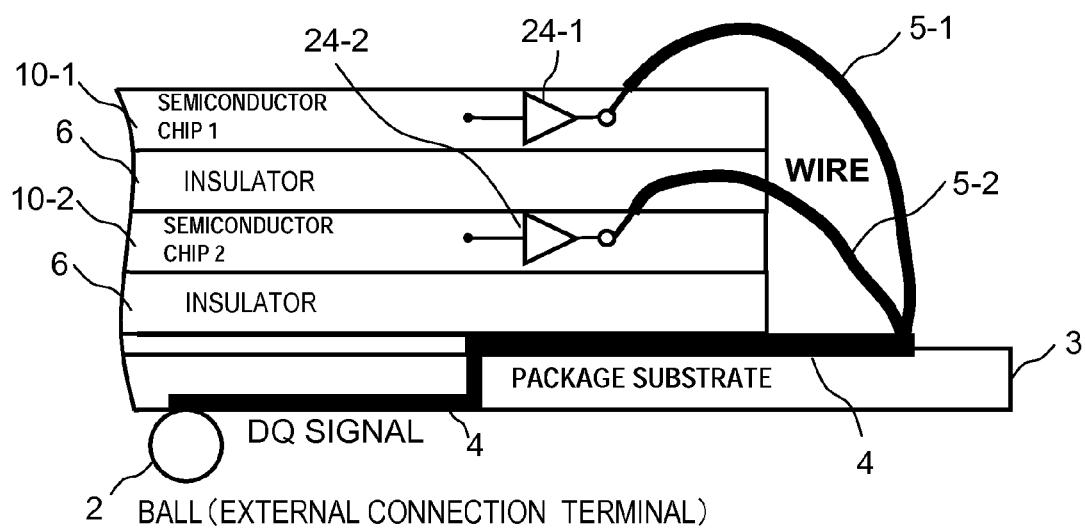
FIG. 2 schematically illustrates a configuration of a semiconductor device for which an IBIS model is extracted.

As illustrated in FIG. 2, a semiconductor device 1 to which the present invention is applicable includes a plurality of semiconductor chips (10-1, 10-2) having a plurality of output buffers (24-1, 24-2) connected to a common external connection terminal 2. When one of the plurality of output buffers is controlled to be active, the other output buffers are controlled to remain inactive. The external connection terminal 2 is connected to a node of a system (a module substrate, a motherboard, or the like).

To extract an IBIS simulation model of this semiconductor device 1, a transistor-level circuit simulation is executed in a state where the above output buffers are connected to the external connection terminal. In this way, AC characteristics (IBIS simulation model) of a single output buffer controlled to be active are extracted (103, 113, 105, and 117 in FIG. 1).

In addition, to extract an output capacitance (IBIS simulation model), output capacitances (transistor-level circuit simulation model) of the individual semiconductor chips are added together. In this way, an output capacitance (IBIS simulation model) of a single output buffer controlled to be active is calculated (102, 114, 104A, and 115 in FIG. 24). If the semiconductor device 1 includes n semiconductor chips having n output buffers and if all the n output buffers have the same characteristics, it is only necessary to multiply the output capacitance of a single buffer by n (102, 114, 104, and 115 in FIG. 1).

In addition, the AC characteristics model (117 in FIG. 1) and the output capacitance model (115 in FIG. 1) obtained by the above transistor-level circuit simulation are used to synthesize an IBIS simulation model (106 in FIG. 1). In this way, an IBIS simulation model (118 in FIG. 1) of the above semiconductor device 1 is extracted.

In accordance with the above simple procedure, an accurate IBIS model can be extracted. In particular, since a transistor-level circuit simulation is executed in a state where the other output buffers that remain inactive are connected to the external connection terminal, an accurate AC characteristics model can be extracted. In addition, by adding all the output capacitances of the individual output buffers including the output buffers that remain inactive, an accurate output capacitance of an IBIS simulation model can be easily extracted.

The present invention has thus been summarized. Next, specific exemplary embodiments will be described in detail with reference to drawings.

[Semiconductor Device for which IBIS Model is Extracted]

FIG. 2 schematically illustrates a cross section of a semiconductor device 1 for which an IBIS model is extracted. More specifically, FIG. 2 illustrates a cross section of one end portion of the semiconductor device 1. In FIG. 2, illustration of a cross section of the other end portion, which is opposite to the one end portion and has a cross section symmetric with respect to that of the one end portion, is omitted.

The semiconductor device 1 includes, at least, a package substrate 3, insulators 6, semiconductor chips (10-1, 10-2), bonding wires (5-1, 5-2), and an external connection terminal 2. The semiconductor chip 2 (10-2) and the semiconductor chip 1 (10-1) are stacked on the package substrate 3 via the insulators 6. More specifically, the semiconductor chip 10-2 is stacked as a lower layer on an insulator 6 on the package substrate 3. Another insulator 6 is stacked on the top of the semiconductor chip 10-2, and the semiconductor chip 10-1 is stacked as an upper layer on the insulator 6. A ball is arranged as the external connection terminal 2 on the back side of the package substrate 3, and the external connection terminal 2 is connected to a common wiring 4, which is a substrate wiring arranged on the package substrate 3 and extends to the front side (opposite to the side on which the external connection terminal 2 is arranged) of the package substrate 3. In addition, the common wiring 4 is connected to branch wirings 5-1 and 5-2 (bonding wires), which are connected to the output nodes of output buffers 24-1 and 24-2 of the semiconductor chips 10-1 and 10-2 via pads (not illustrated), respectively. While the entire semiconductor device 1 is covered by a package of resin, ceramic, or the like, illustration of the package covering the entire semiconductor device 1 is omitted in FIG. 2.

Figure 3:
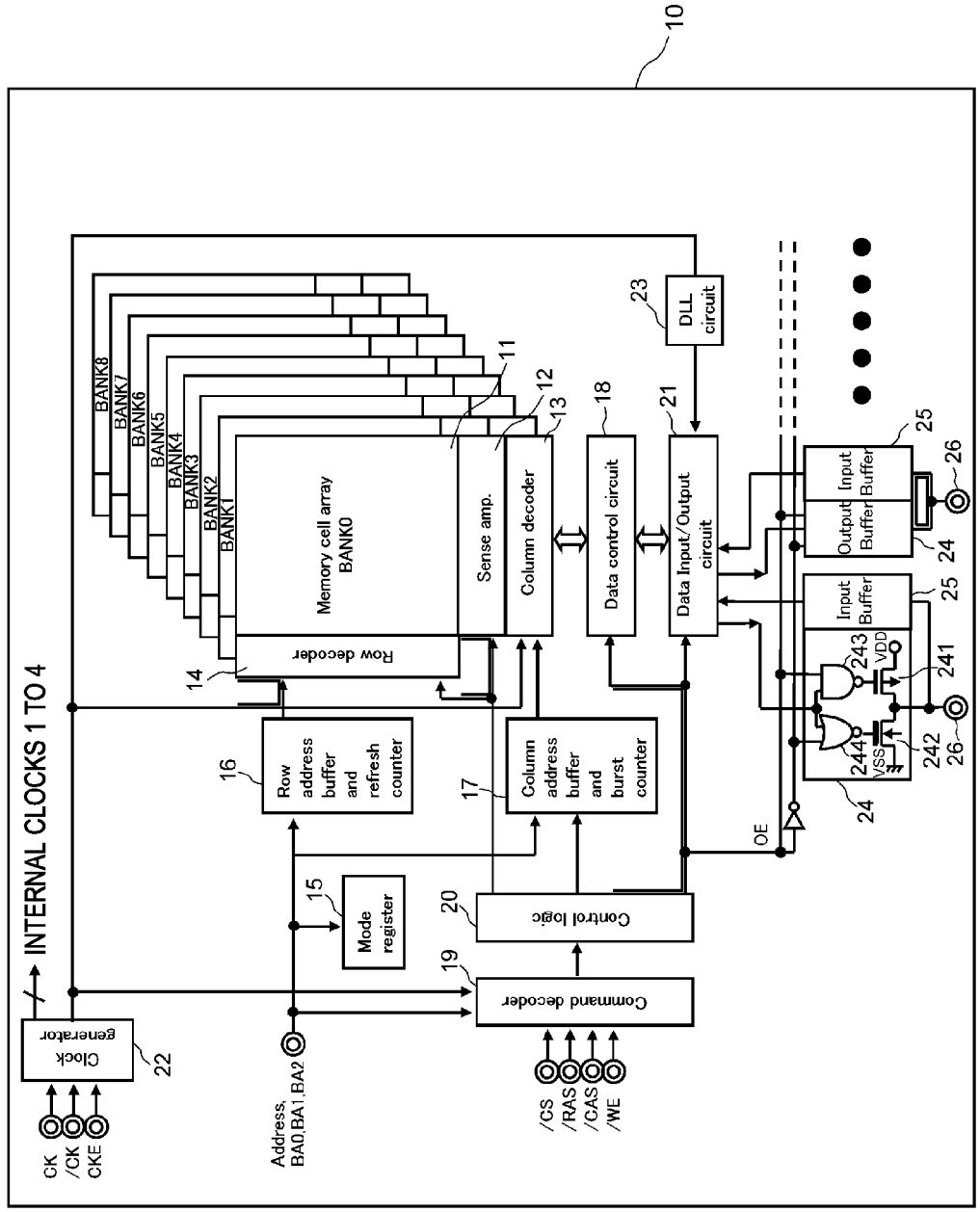
FIG. 3 is a circuit block diagram illustrating a semiconductor chip used in the semiconductor device for which an IBIS model is extracted.

FIG. 3 is a block diagram illustrating a semiconductor chip 10 mounted on the semiconductor device 1. The semiconductor chip 10 illustrated in FIG. 3 is a double data rate (DDR) synchronous dynamic random access memory (SDRAM) chip with an 8-bank configuration. In FIG. 3, a row decoder 14 decodes a row address and drives a selected word line (not illustrated). A sense amplifier 12 amplifies data read to a bit line (not illustrated) in a memory cell array 11. When a refresh operation is executed, the sense amplifier 12 amplifies cell data read to a bit line connected to cells of a word line selected by a refresh address and writes the data back in the cells. A column decoder 13 decodes a column address, turns on a selected Y-switch (not illustrated) to select a bit line, and establishes connection to an IO line (not illustrated). A command decoder 19 receives a predetermined address signal and control signals, such as a chip select signal /CS, a row address strobe signal /RAS, a column address strobe signal /CAS, and a write enable signal /WE, and decodes commands (slash mark / represents a signal brought to be active at a low level). A column address buffer and burst counter 17 is controlled by a control logic 20 (clock generation circuit) that receives a control signal from the command decoder 19. In addition, based on a received column address, the column address buffer and burst counter 17 generates an address of a burst length and supplies the address to the column decoder 13. A mode register 15 receives an address signal and bank-selection signals BA0, BA1, and BA2 (for selecting one of the eight banks) and outputs a control signal to the control logic 20.

In addition, the control logic 20 controls the state (active or inactive) of each output buffer 24. When the output buffer 24 of the semiconductor chip 1 (10-1) is enabled, an output enable signal OE of the semiconductor chip 1 (10-1) is enabled. However, an output enable signal OE of the semiconductor chip 2 (10-2) is disenabled. Thus, either one of the plurality of output buffers (24-1, 24-2) is controlled to be active.

The row address buffer of a row address buffer and refresh counter 16 receives a row address and outputs the row address to the row decoder 14. The refresh counter receives a refresh command, executes a count-up operation, and outputs results of the operation as a refresh address. The row address from the row address buffer and the refresh address from the refresh counter are inputted to a multiplexer (not illustrated). When a refresh operation is executed, the refresh address is selected. Otherwise, the row address from the row address buffer is selected and supplied to the row decoder 14.

A clock generator 22 receives complementary external clocks CK and /CK supplied to the DRAM device. When a clock enable signal CKE is at a high level, the clock generator 22 outputs internal clocks, and when the clock enable signal CKE is brought to a low level, the clock generator 22 stops supplying the clocks.

A data control circuit 18 inputs and outputs write and read data. When outputting read data, a data input/output circuit 21 converts data read in parallel from the data control circuit 18 into serial data in synchronization with a clock signal supplied from a DLL circuit. Next, the data input/output circuit 21 outputs the serial data to the outside. When receiving write data, the data input/output circuit 21 converts serial data from the outside into parallel data and outputs the converted parallel data to the data control circuit 18.

Each output buffer 24 receives an output enable signal OE outputted from the control logic 20 and an output signal outputted from the data input/output circuit 21 and has an output node connected to a DQ signal input/output pad 26. The output buffer 24 has a NAND gate 243 receiving the output enable signal OE and an output signal outputted from the data input/output circuit 21 and a NOR gate 244 receiving an inverted signal of the output enable signal OE and the output signal outputted from the data input/output circuit 21. The NAND gate 243 has an output node connected to a gate of a P-channel output transistor 241 having a source connected to a power supply VDD and a drain connected to the DQ signal input/output pad 26. The NOR gate 244 has an output node connected to a gate of an N-channel output transistor 242 having a source connected to a power supply VSS and a drain connected to the DQ signal input/output pad 26.

When the output enable signal OE is at a high level, based on read data outputted from the data input/output circuit 21, one of the P-channel output transistor 241 and the N-channel output transistor 242 of an output buffer 24 is brought to be conductive. The read data from the DQ signal input/output pad 26 is outputted in synchronization with a clock signal. On the other hand, when the output enable signal OE is at a low level, irrespective of data outputted from the data input/output circuit 21, both the P-channel output transistor 241 and the N-channel output transistor 242 remain non-conductive. Namely, the output node of the output buffer 24 remains in a high-impedance state.

An input buffer 25 is arranged between the DQ signal input/output pad 26 and the data input/output circuit 21. During a write operation, the input buffer 25 transfers data inputted from the DQ signal input/output pad 26 to the data input/output circuit 21. In reality, a plurality of DQ signal input/output pads 26 are arranged so that multiple-bit data can be inputted and outputted in parallel. The output buffers 24 and the input buffers 25 correspond to the DQ signal input/output pads 26 of each bit. Thus, the number of output buffers 24 and the number of the input buffers 25 are the same as the number of the DQ signal input/output pads 26.

Figure 4:
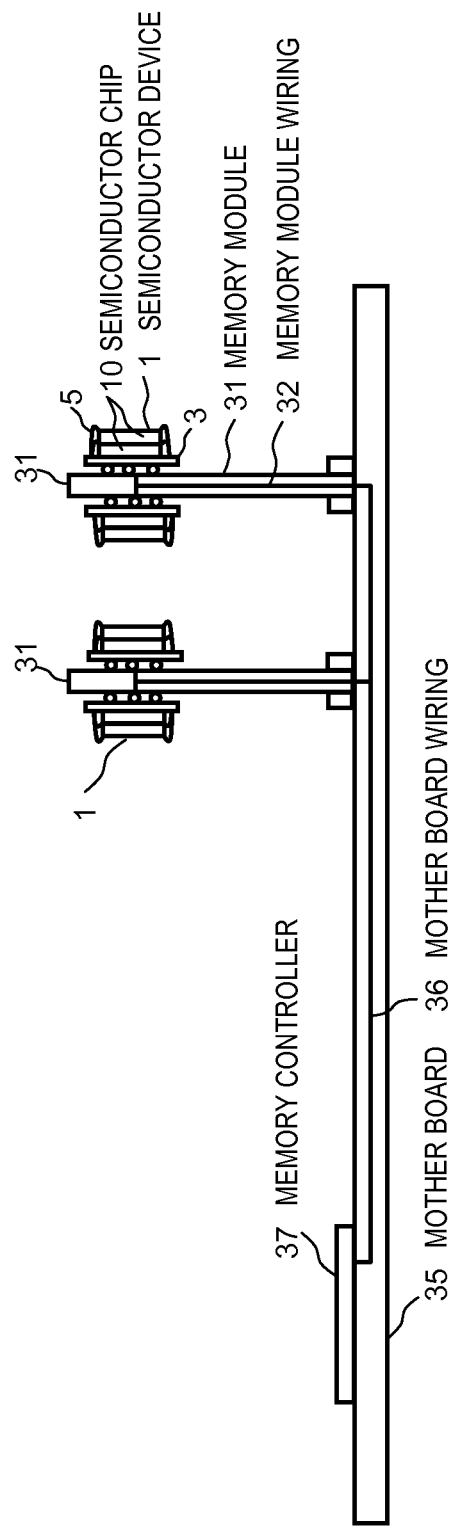
FIG. 4 schematically illustrates a substrate on which semiconductor devices, for which an IBIS model is extracted, are mounted.

FIG. 4 schematically illustrates a substrate on which semiconductor devices, for which an IBIS model is extracted, are mounted. In FIG. 4, a memory controller 37 and a plurality of memory modules 31 are mounted on a motherboard 35. In addition, a plurality of semiconductor devices 1 are mounted on each memory module 31. In FIG. 4, two semiconductor devices 1 are mounted on each memory module substrate 31: one on the front side and the other on the back side. As described with reference to FIG. 2, a semiconductor device 1 includes a plurality of semiconductor chips 10 stacked on the package substrate 3, and the output buffers of the individual semiconductor chips 10 are connected to a memory module wiring (DQ signal wiring) 32 via the bonding wires 5 and a ball. The output buffers are also connected to the memory controller 37 via a motherboard wiring (DQ signal wiring) 36 arranged on the motherboard 35.

It is necessary to execute a simulation to grasp how data outputted from a semiconductor device 1 is transferred to the memory controller 37 through the DQ signal wirings, in view of a single memory module substrate 31 or the entire system including the motherboard 35. Thus, a simple method for extracting an accurate IBIS simulation model of the semiconductor device 1 is necessary.

[IBIS Simulation Model]

Figure 5A:
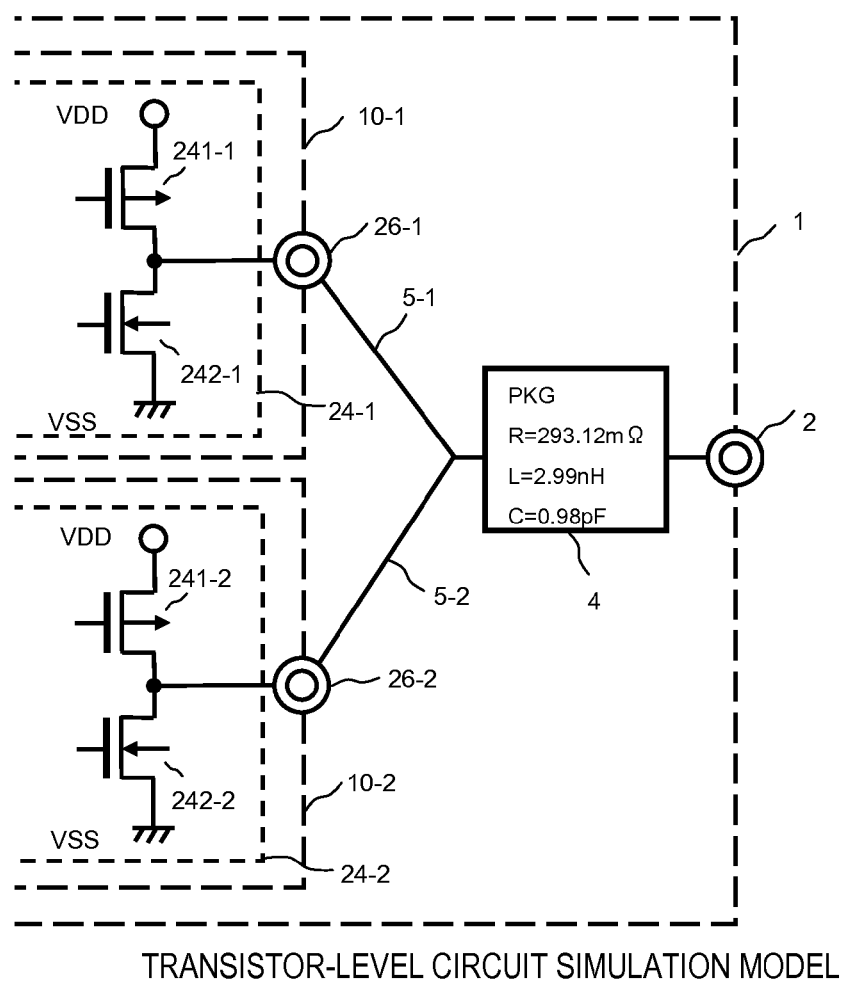
FIGS. 5A and 5B illustrate models of a semiconductor device viewed from an external connection terminal.
Figure 5B:
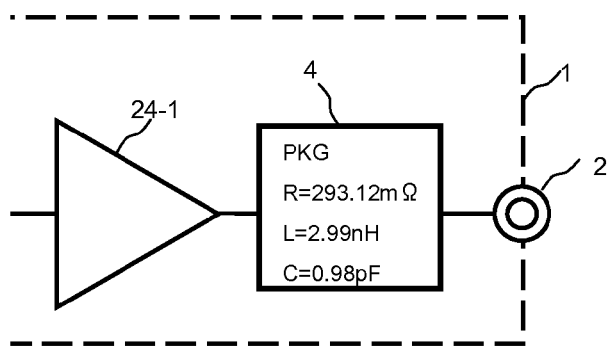

FIGS. 5A and 5B illustrate models of the inside of the semiconductor device 1 viewed from an external connection terminal (a DQ terminal of the semiconductor device 1): FIG. 5A illustrates a model based on a transistor-level circuit simulation such as SPICE and FIG. 5B illustrates a model based on an IBIS simulation.

As illustrated in FIG. 5A, the transistor-level circuit simulation can faithfully model a semiconductor-device circuit structure, including P-channel output transistors 241-1 and 241-2 and N-channel output transistors 242-1 and 242-2 included in the output buffers 24-1 and 24-2 in the semiconductor chips 10-1 and 10-2.

On the other hand, based on the IBIS simulation model, when the output buffer 24-1 is controlled to be active to output data, the output buffer 24-2 is controlled to remain inactive (high-impedance state). Thus, the IBIS simulation model is obtained assuming that only the single output buffer 24-1 is present, and the interaction between the output buffers 24-1 and 24-2 is ignored. In other words, the model is obtained assuming that the output buffer 24-2 controlled to remain inactive is not present. In addition, the wirings between the output buffer 24-1 and the external connection terminal (DQ terminal) 2 are deemed to have resistance R, inductance L, and capacitance C collectively as a package (R=293.12 mΩ, L=2.99 nH, and C=0.98 pF in FIG. 5B).

Next, extraction of an IBIS simulation model from a transistor-level circuit simulation model will be described.

FIGS. 6A to 6D are measurement circuit diagrams illustrating four conditions of output buffer V-time tables (AC characteristics) of an IBIS simulation model: FIGS. 6A to 6D illustrate rising and pull-up conditions; falling and pull-up conditions; rising and pull-down conditions; and falling and pull-up conditions, respectively.

Figure 6A:
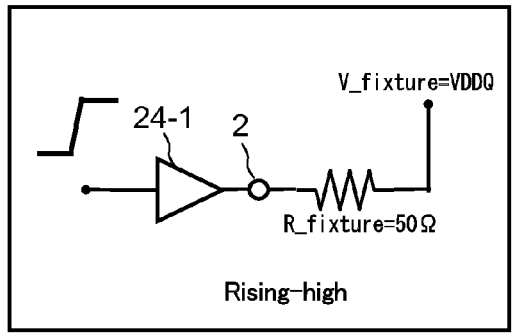
FIGS. 6A to 6D are measurement circuit diagrams illustrating four conditions of output buffer V-time tables (AC characteristics) of an IBIS simulation model.

Based on the rising and pull-up conditions in FIG. 6A, a voltage at the external connection terminal 2 is pulled up to a fixed voltage VDDQ by a fixed resistor 50 Ω arranged outside the semiconductor device 1. By increasing the output buffer from a low level to a high level, a waveform in which the voltage at the external connection terminal 2 is increased from a low level to a high level is modeled with time t and voltage V.

Figure 6B:
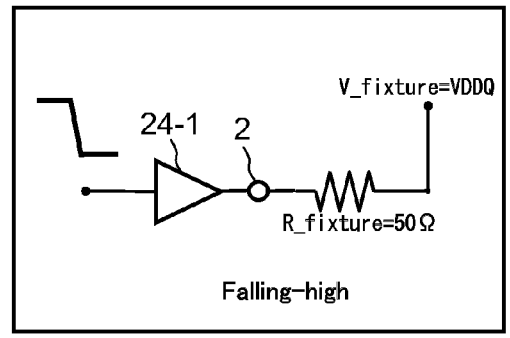

Similarly, based on the falling and pull-up conditions in FIG. 6B, a voltage at the external connection terminal 2 is pulled up to the fixed voltage VDDQ by the fixed resistor 50 Ω arranged outside the semiconductor device 1. By decreasing the output buffer from a high level to a low level, a waveform in which the voltage at the external connection terminal 2 is decreased from a high level to a low level is modeled with time t and voltage V.

Figure 6C:
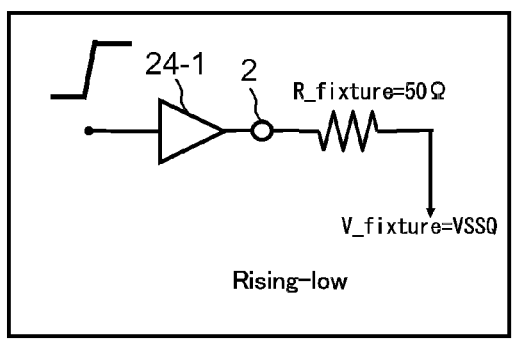
Figure 6D:
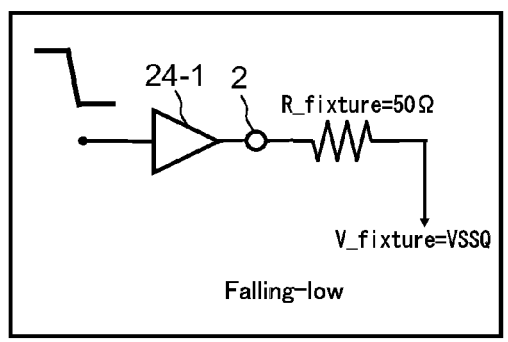

The rising and pull-down conditions in FIG. 6C are the same as the rising and pull-up conditions in FIG. 6A, except that a voltage at the external connection terminal 2 is pulled down to a fixed voltage VSSQ by the fixed resistor 50 Ω. The falling and pull-down conditions in FIG. 6D are the same as the falling and pull-up conditions in FIG. 6B, except that the fixed resistor in FIG. 6D functions as a pull-down resistor.

Figure 7A:
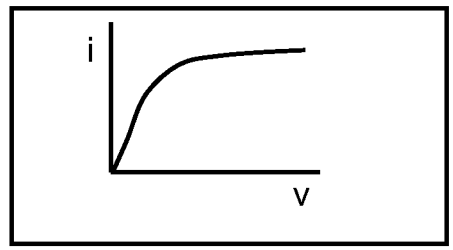
FIGS. 7A to 7C schematically illustrates IV characteristics, AC characteristics (V-time tables), and output capacitance characteristics of an IBIS simulation model.
Figure 7B:
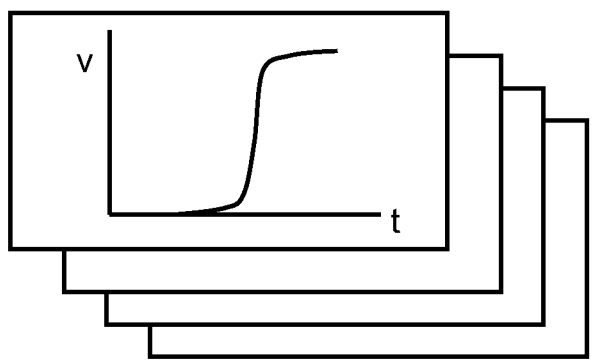
Figure 7C:
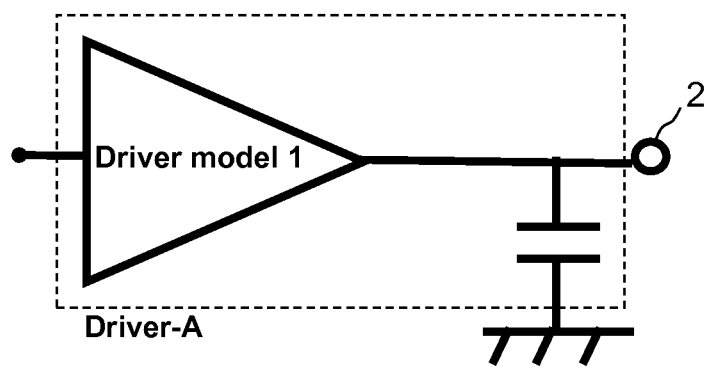
Figure 8A:
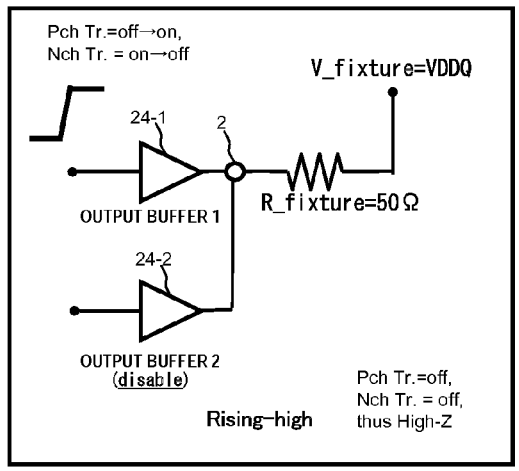
FIGS. 8A to 8D illustrate circuits on which a transistor-level circuit simulation for extracting V-time tables (AC characteristics) is executed, according to the first exemplary embodiment.
Figure 8B:
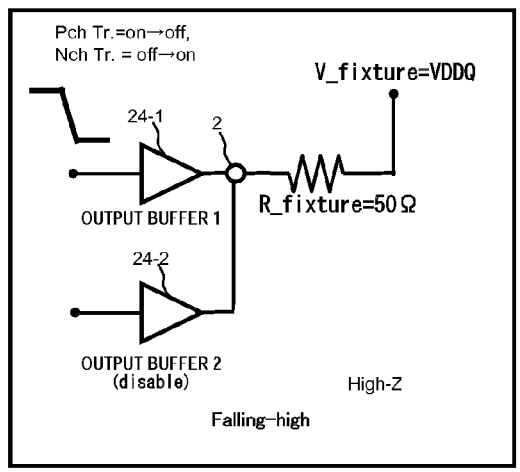
Figure 8C:
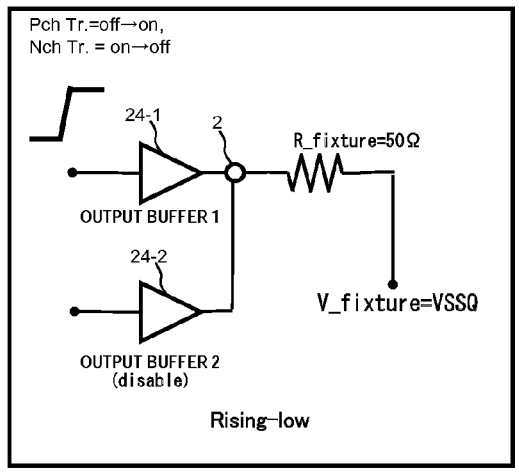
Figure 8D:
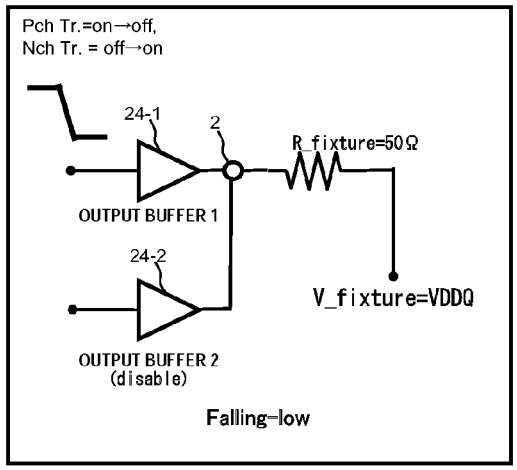

FIGS. 7A to 7C illustrate IV characteristics, AC characteristics (V-time tables), and output capacitance characteristics of an IBIS simulation model, respectively. The IV characteristics in FIG. 7A illustrate DC characteristics of an output voltage and an output current when an output buffer is conductive. The AC characteristics (V-time tables) in FIG. 7B are as described with reference to FIGS. 6A to 6D. FIG. 20 illustrates V-time tables representing AC characteristics. FIG. 7C illustrates an output capacitance of the output buffer. Namely, as an IBIS simulation model, it is necessary to extract the above IV characteristics model, AC characteristics (V-time tables) model, and output capacitance model.

COMPARATIVE EXAMPLE

Regarding extraction of an IBIS model of the above semiconductor device 1, the present inventors first made the following premises: the two semiconductor chips 10-1 and 10-2 of an identical product type are stacked; and the output buffers 24-1 and 24-2 of an identical type are connected to the single external connection terminal 2. In addition, between the output buffers 24-1 and 24-2 connected to the external connection terminal 2, only the output buffer 24-1 is controlled to be active (the output enable signal OE is brought to a high level). The other output buffer 24-2 is controlled to remain inactive (the output enable signal OE remains at a low level). In addition, wirings arranged from the semiconductor chips 10-1 and 10-2 toward the external connection terminal 2 are short branch wirings 5-1 and 5-2 (see FIG. 4) having approximately the same length.

Figure 15:
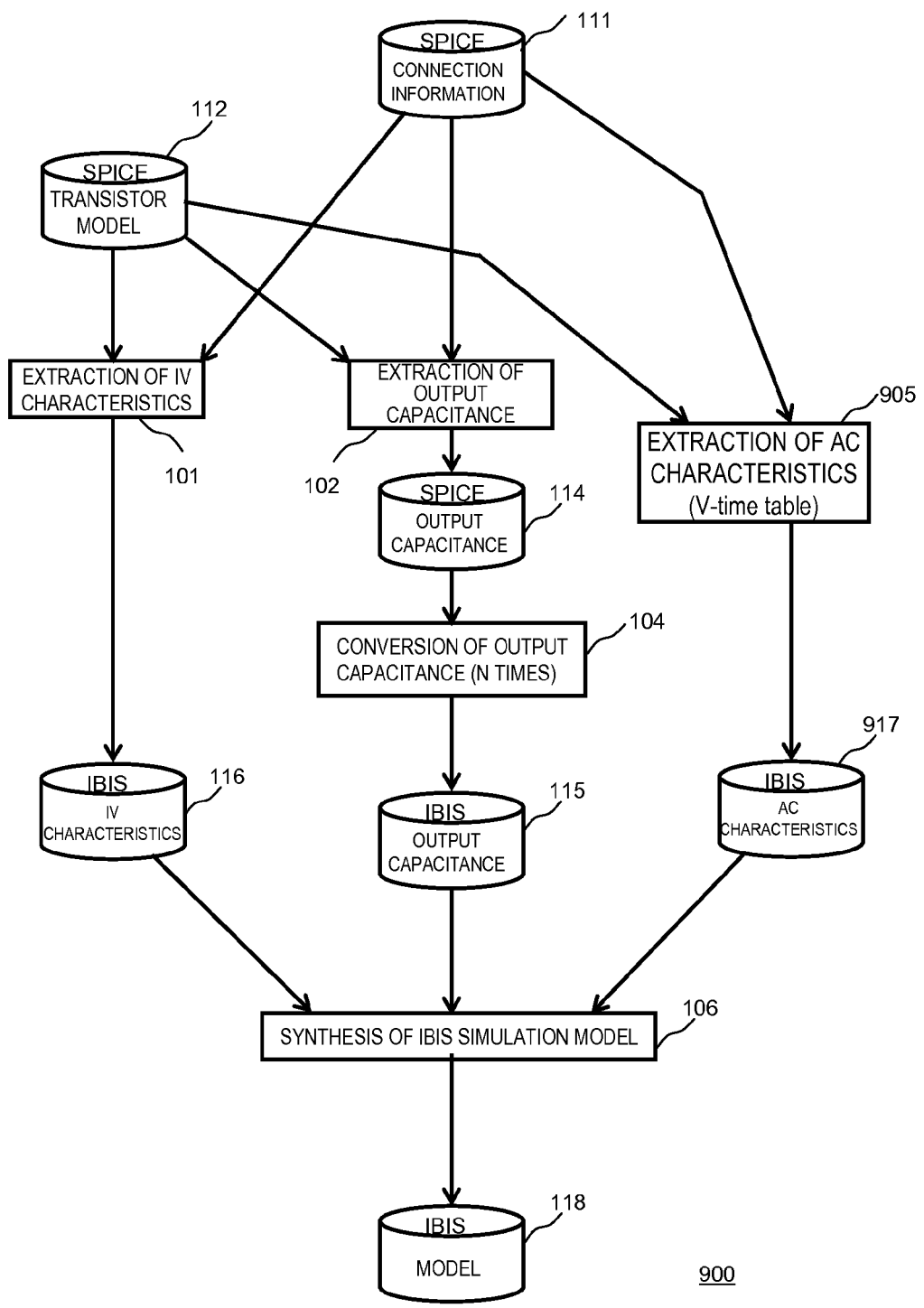
FIG. 15 is a flow chart illustrating a data/process flow according to comparative example 1.

Under the above premises, the inventors conceived the procedure illustrated in FIG. 15 to extract an IBIS simulation model from a transistor-level circuit simulation model of the semiconductor chips 10. The present inventors conceived that it is only necessary to extract IV characteristics of one of the two output buffers from a transistor-level circuit simulation and use the extracted IV characteristics as the IV characteristics of an IBIS simulation model (101 and 116 in FIG. 15).

In addition, since both of the output buffers 24-1 and 24-2 are connected to the single external connection terminal 2, the present inventors conceived that it is only necessary to obtain an output capacitance value of the single output buffer 24-1 and double the value (102, 114, 104, and 115 in FIG. 15).

In addition, the present inventors conceived that it is only necessary to extract AC characteristics (V-time tables) of the single output buffer 24-1 and use the AC characteristics as the AC characteristics of an IBIS simulation model (905 and 917 in FIG. 15).

Finally, the present inventors conceived that an IBIS simulation model can be extracted by synthesizing the IV characteristics, output capacitance, and AC characteristics models obtained in accordance with the above procedure (106 and 118 in FIG. 15).

Figure 9A:
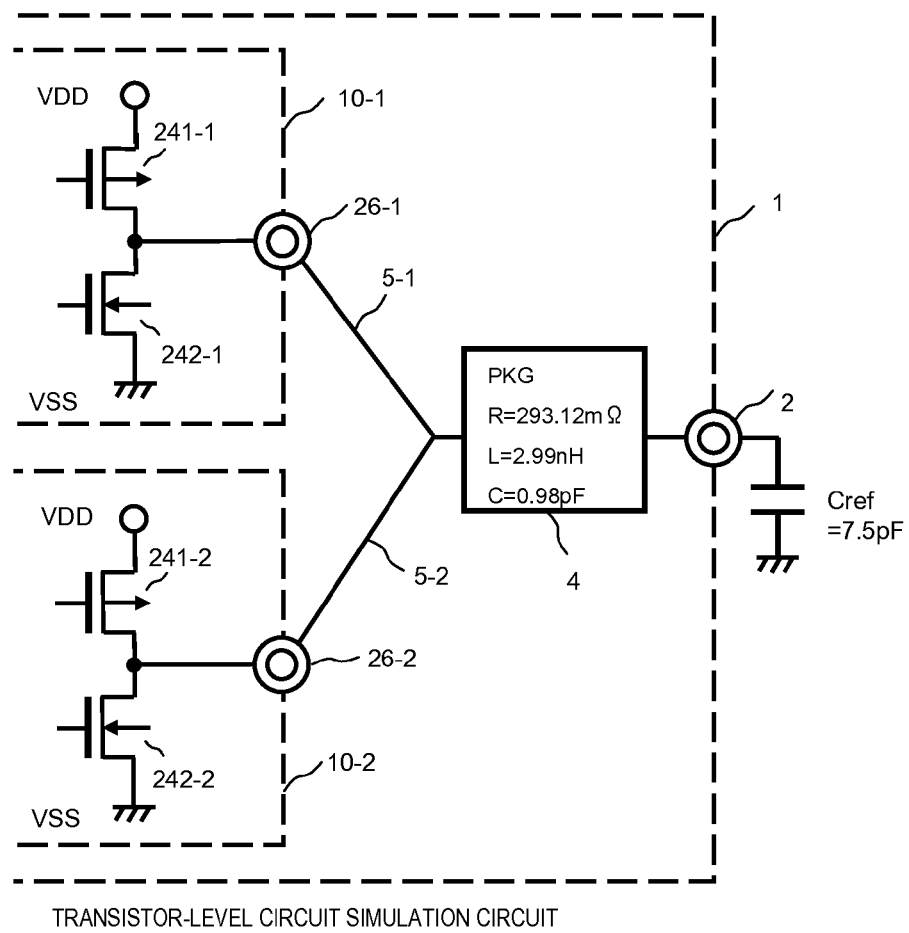
FIGS. 9A and 9B are simulation circuit diagrams.
Figure 9B:
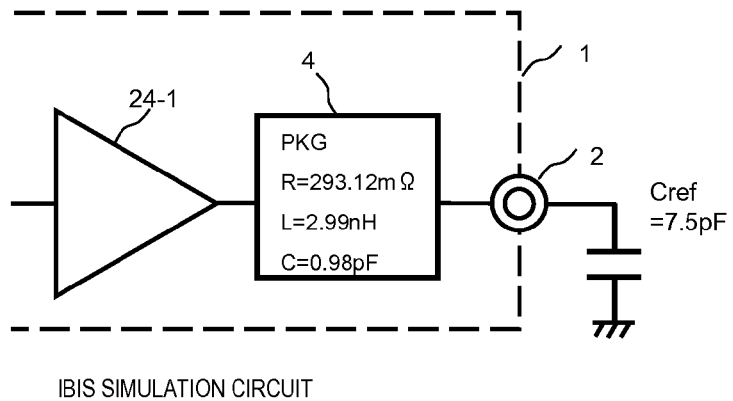

An IBIS simulation was executed on a circuit illustrated in FIG. 9B, using an IBIS simulation model of the semiconductor device 1 extracted in accordance with the procedure illustrated in FIG. 15. FIG. 9B illustrates a circuit in which a capacitance Cref (7.5 pF) is arranged between the external connection terminal 2 of the semiconductor device 1 and the ground. For comparison, a transistor-level circuit simulation was also executed on a circuit illustrated in FIG. 9A, using a transistor-level circuit simulation model.

Figure 16A:
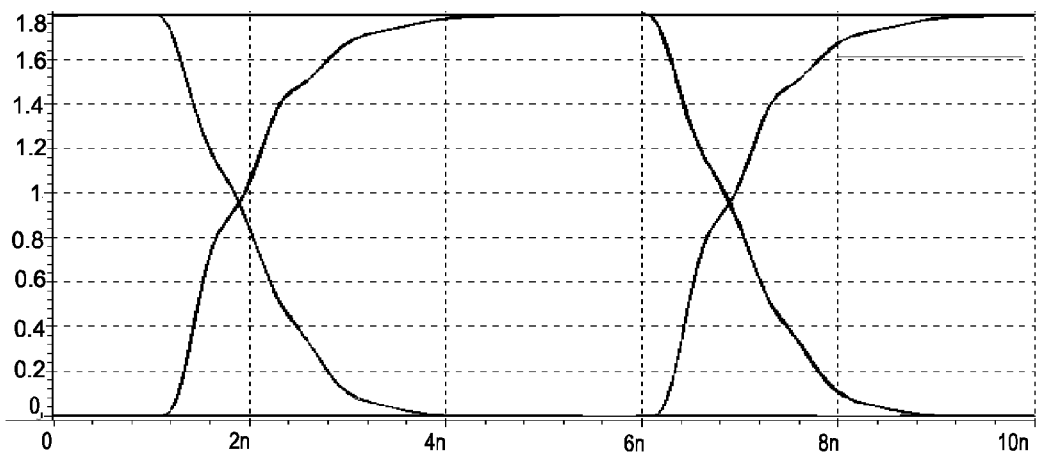
FIGS. 16A and 16B illustrate simulation results.
Figure 16B:
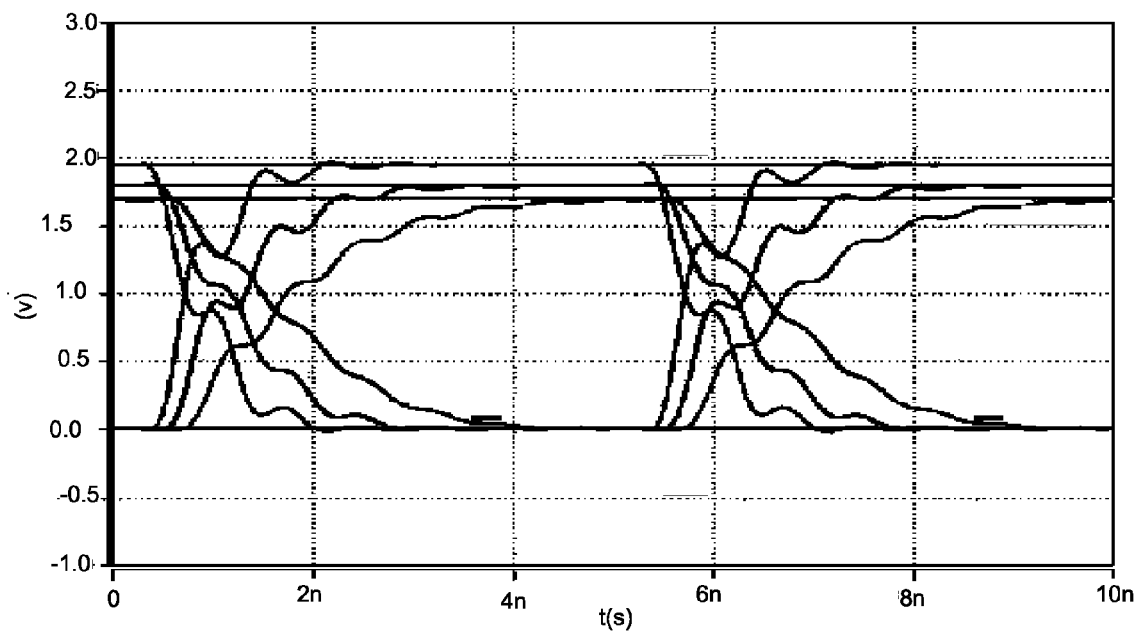

FIGS. 16A and 16B illustrate results of the simulations. FIG. 16A illustrates results of the transistor-level circuit simulation as a reference executed on the circuit in FIG. 9A. FIG. 16B illustrates results of the simulation using the IBIS model extracted in accordance with the procedure in FIG. 15. In FIG. 16A, a SPICE transistor model was used, and the simulation was executed by a SPICE simulation tool. In FIG. 16B, an IBIS simulation tool (tool A) was used to execute the IBIS simulation. The above SPICE tool and tool A are provided in the same tool. In FIGS. 16A and 16B, the horizontal axis represents time ns and the vertical axis represents voltage V.

In addition, in FIG. 16A, when the transistor-level circuit simulation was executed, only a power-supply voltage value TYP was measured. However, in FIG. 16B, when the IBIS model simulation was executed, three voltage values MAX, TYP, and MIN were measured. The voltage MAX represents the earliest rising and falling edges, and the voltage MIN represents the latest rising and falling edges. The voltage TYP is illustrated between the voltages MAX and MIN.

Figure 17:
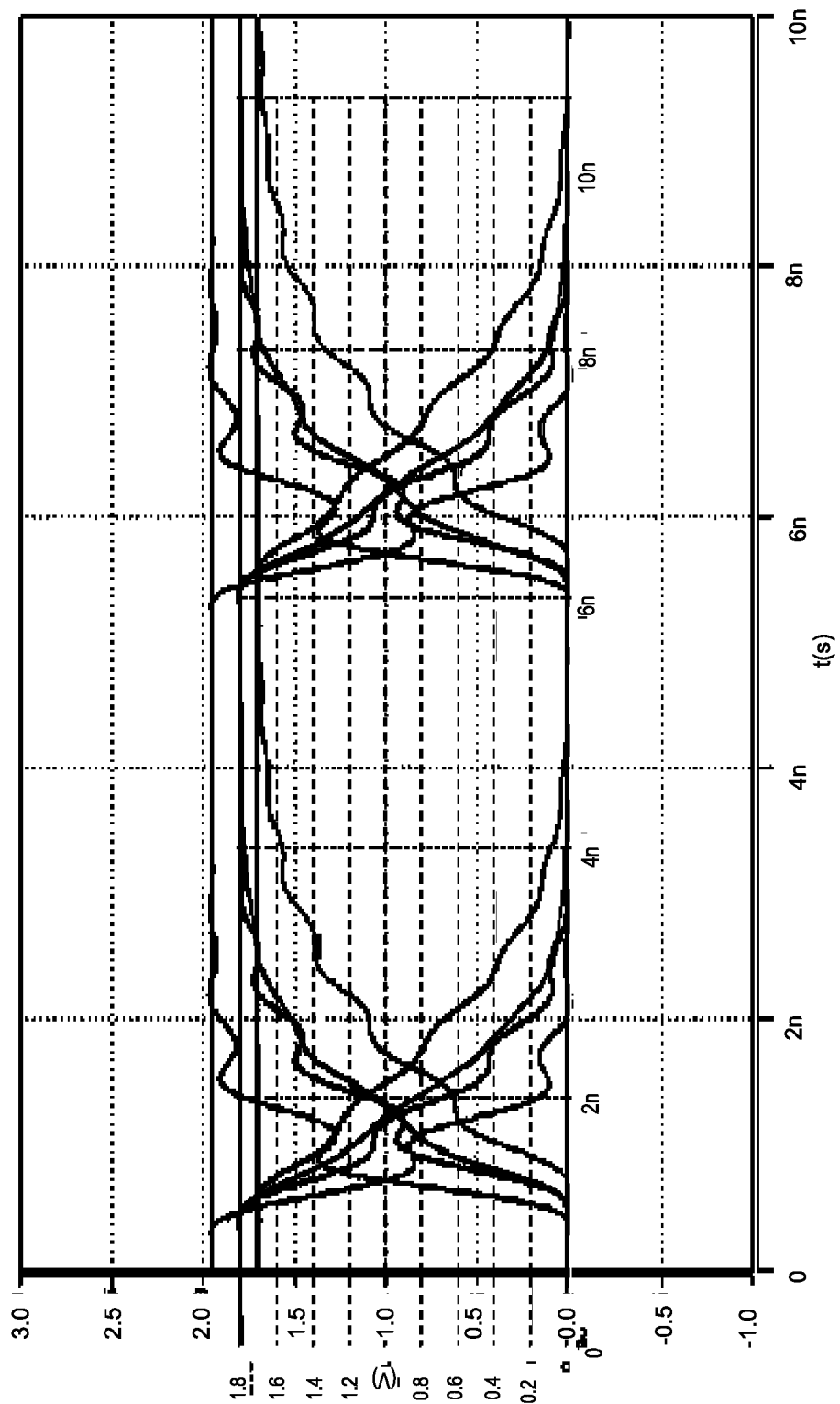
FIG. 17 is a graph in which the results of the simulation using the IBIS model extracted according to the comparative example in FIG. 16B are overlaid with the results of the transistor-level circuit simulation.

As illustrated in FIG. 16A, the reference transistor-level circuit simulation produced relatively smooth rising and falling waveforms. In contrast, as illustrated in FIG. 16B, the IBIS simulation using the IBIS model extracted in accordance with the procedure in FIG. 15 produced the waveforms that ripple more when rising and falling. FIGS. 16A and 16B are overlaid in FIG. 17.

Figure 18:
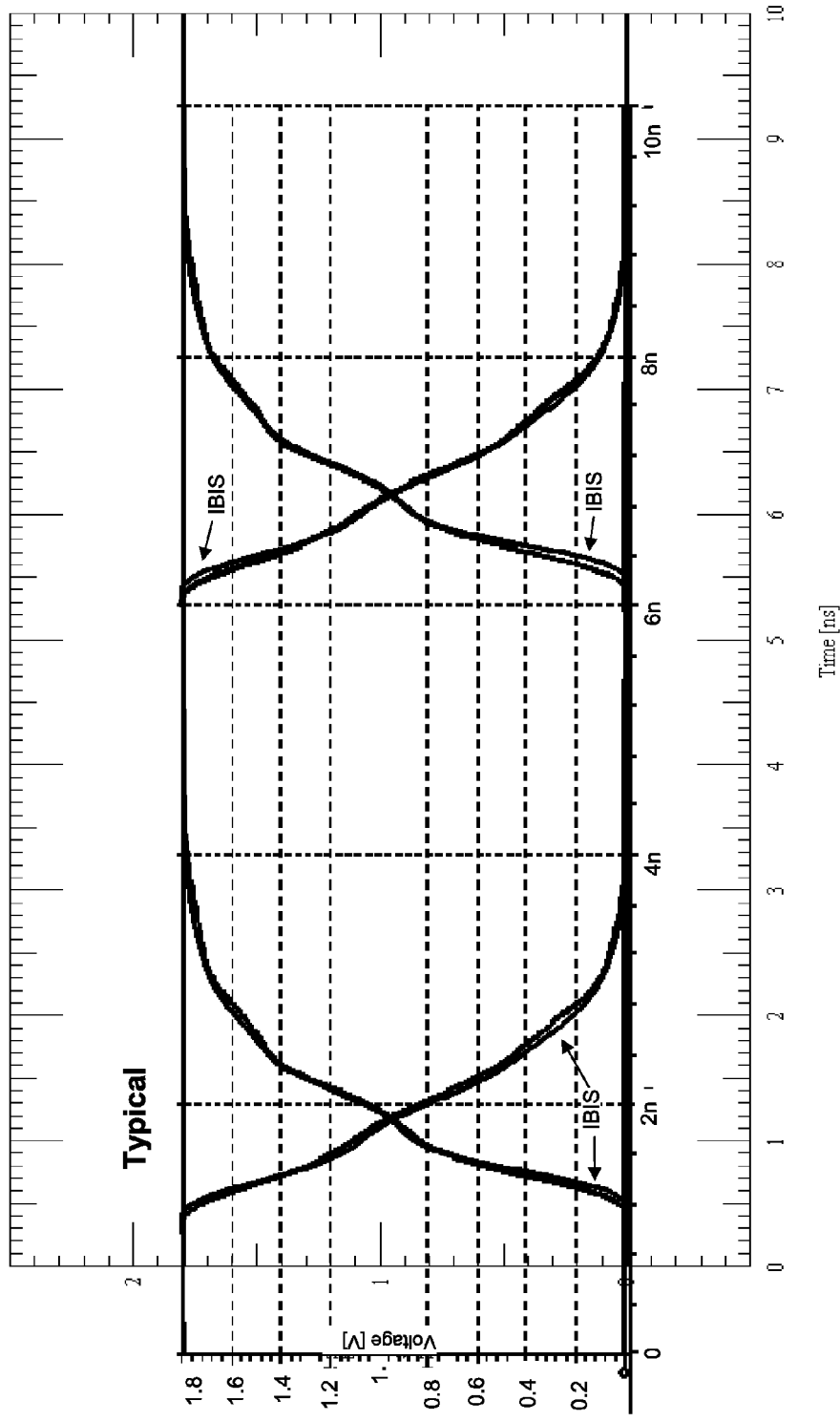
FIG. 18 is a graph in which results of a simulation using the IBIS model extracted according to the comparative example and using an IBIS simulation tool different from that used in FIGS. 16B and 17 are overlaid with the results of the reference transistor-level circuit simulation.

FIG. 18 illustrates results of an IBIS simulation using the IBIS model used in FIG. 16B and extracted in accordance with the procedure in FIG. 15. In FIG. 18, an IBIS simulation tool B was used, instead of the tool A. Both the tools A and B are analog simulators. FIG. 18 illustrates only the TYP values. In addition, in FIG. 18, the results of the IBIS simulation are overlaid with the results of the simulation using the SPICE transistor model and the SPICE simulation tool in FIG. 16A. Only the differences between the results of the IBIS simulation and the results of the reference SPICE simulation are indicated by arrows. While the differences in FIG. 18 are not as significant as those in FIGS. 16A, 16B, and 17, the results of the IBIS simulation do not match the results of the reference SPICE simulation using the SPICE transistor model.

Figure 19:
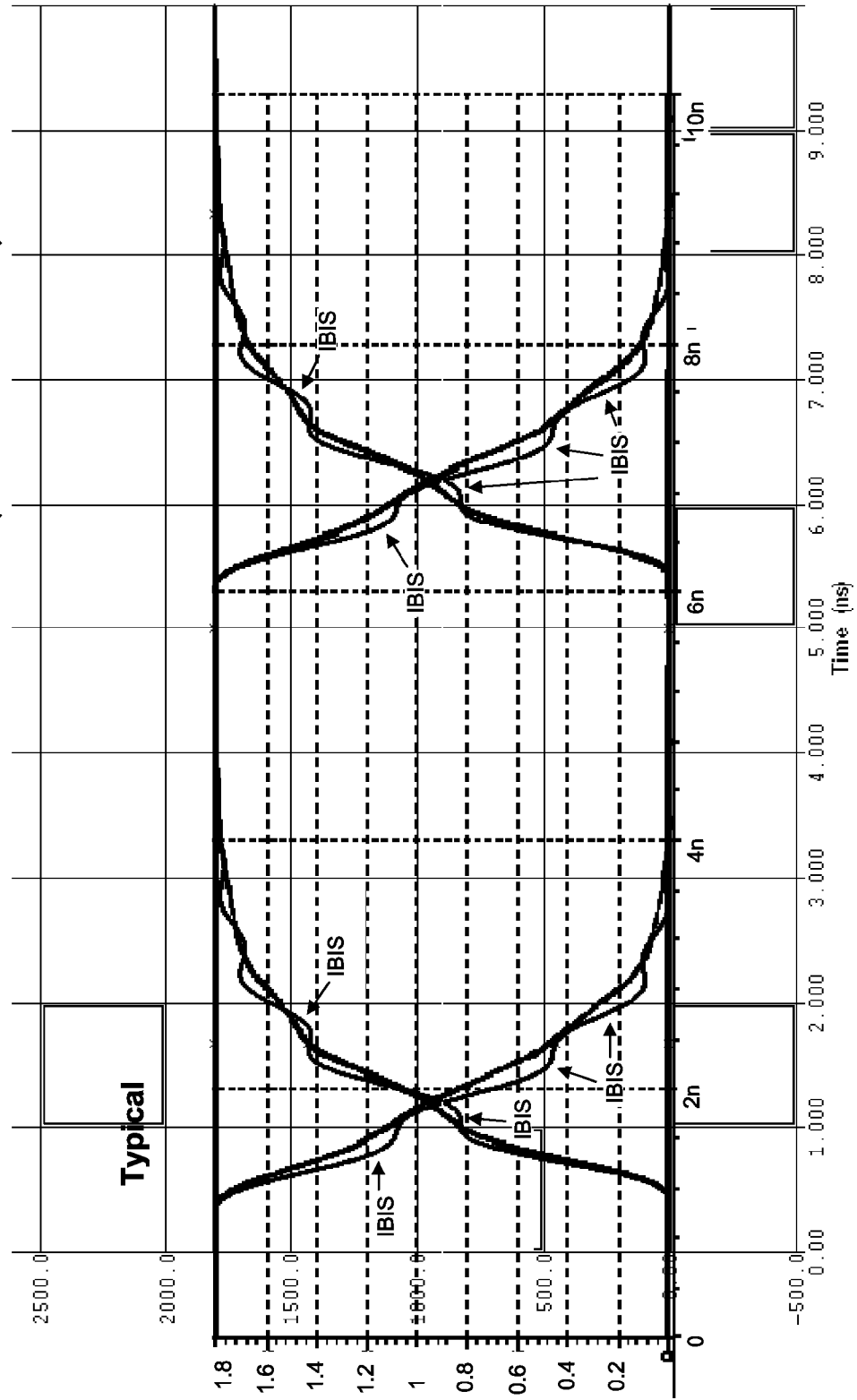
FIG. 19 is a graph in which results of a simulation using the IBIS model extracted according to the comparative example and using an IBIS simulation tool different from those used in FIGS. 16B, 17, and 18 are overlaid with the results of the reference transistor-level circuit simulation.

FIG. 19 illustrates results of an IBIS simulation using the IBIS model used in FIG. 16B and extracted in accordance with the procedure in FIG. 15. In FIG. 19, an IBIS simulation tool C was used. The tool C is also an analog simulator, as in the case of the tools A and B. FIG. 19 illustrates only the TYP value. In addition, in FIG. 18, the results of the IBIS simulation are overlaid with the results of the simulation using the SPICE transistor model and the SPICE simulation tool in FIG. 16A. Only the differences between the results of the IBIS simulation and the results of the reference SPICE simulation are indicated by arrows. As illustrated in FIG. 19, when the IBIS model extracted in accordance with the procedure in FIG. 15 was used, rippling waveforms were obtained. Namely, the results of the IBIS simulation do not match the results of the transistor-level circuit simulation.

Next, a plurality of comparative examples obtained based on the above experiment results and preferable exemplary embodiments of the present invention will be described.

[First Exemplary Embodiment]

FIG. 1 is a flow chart illustrating a data/process flow of an IBIS simulation model extraction method according to a first exemplary embodiment. First, premises of the process flow in FIG. 1 will be described. A semiconductor device 1 includes n semiconductor chips 10 (n is an integer not less than two), and each of the n semiconductor chips 10 includes an output buffer 24. When one of the n output buffers 24 included in the semiconductor chips 10 is controlled to be active, the other n−1 output buffer 24 is controlled to remain inactive. These output buffers 24 can be controlled in this way by supplying each of the semiconductor chips 10 with a different control signal from the outside. In addition, an identical transistor model can be used for the n semiconductor chips. Thus, when viewed from the external connection terminal 2, each of the n output buffers 24 exhibits the same electrical characteristics. Under such premises, the process flow in FIG. 1 will be hereinafter described.

In the process flow in FIG. 1, a transistor model 112 of the semiconductor chips 10 and connection information 111 (net list 111) about transistors including the output buffers 24 are entered. The connection information 111 includes layout information about transistor sizes and the like. The n semiconductor chips 10 share the same transistor model 112 and connection information 111.

In an IV characteristics extraction process 101, based on the connection information 111 and the transistor model 112 about an output buffer 24, IV characteristics are extracted from a transistor model circuit simulation. The IV characteristics are extracted when a P-channel MOS transistor 241 and an N-channel MOS transistor 242 (see in FIG. 3) of the output buffer 24 are controlled to be conductive and non-conductive, respectively and vice versa. The results are outputted as an IBIS-IV characteristics model 116 of the output buffers 24.

In an output capacitance extraction process 102, based on the connection information 111 and the transistor model 112 about an output buffer 24, an output capacitance of the output buffer 24 is obtained by a transistor-level circuit simulation as a circuit simulation output capacitance model 114. In this output capacitance extraction process 102, the output capacitance of a single output buffer 24 of a single semiconductor chip 10 is obtained, between the n output buffers of the n semiconductor chips 10 connected to the external connection terminal 2.

Next, in an output capacitance conversion process 104, the capacitance of the single output buffer 24 of the single semiconductor chip 10 obtained in the output capacitance extraction process 102 is multiplied by n. In this way, the capacitance of the n output buffers 24 connected to the external connection terminal 2 is obtained as an IBIS output capacitance model 115.

As illustrated in FIG. 5A, the output buffers 24-1 and 24-2 of the n semiconductor chips 10-1 and 10-2 have respective output nodes connected to each other outside the semiconductor chips 10-1 and 10-2. Thus, in a connection information synthesis process 103 (net list synthesis process 103), synthesized connection information 113 (synthesized net list 113), in which output data from the n output buffers of the n semiconductor chips are synthesized, is generated from the connection information 111 about one chip.

In an AC characteristics (V-time tables) extraction process 105, based on the synthesized connection information 113 synthesized in the connection information synthesis process 103 and based on the transistor model 112, a transistor-level circuit simulation is executed in a state where the n output buffers 24 are synthesized. V-time tables (an IBIS-AC characteristics model 117) of one of the n output buffers 24 are extracted. In this AC characteristics (V-time tables) extraction process 105, a transistor-level circuit simulation is executed in a state where only one output buffer 24 is active and the other n−1 output buffer 24 remains in a high-impedance state.

FIGS. 8A to 8D illustrate circuits on which a simulation for extracting V-time tables (AC characteristics) is executed in the AC characteristics (V-time table) extraction process 105. The extraction is executed in a state where the output buffers 24-1 and 24-2 of the two semiconductor chips are synthesized. FIGS. 8A to 8D are extraction circuit diagrams illustrating rising and pull-up conditions; falling and pull-up conditions; rising and pull-down conditions; and falling and pull-down conditions, respectively. The above four conditions are similar to those described with reference to FIGS. 6A to 6D. However, based on the conditions in FIGS. 8A to 8D, a transistor-level circuit simulation is executed in a state where the plurality of output buffers 24 are connected to each other, to extract the V-time tables (IBIS-AC characteristics model 117).

Even when the output nodes of the n output buffers are connected to the external connection terminal, only one of the n output buffers is controlled to be active. The other n−1 output buffer is controlled to remain inactive in a high-impedance state. The output transistors 241 and 242 of the output buffer 24 remaining in a high-impedance state are effective as load capacitance. The method according to the first exemplary embodiment can extract the V-time tables (IBIS-AC characteristics model 117) while accurately capturing the load capacitance of the output transistors 241 and 242 of the output buffer that remains in a high-impedance state.

In an IBIS simulation model synthesis process 106 in FIG. 1, the IBIS-IV characteristics model 116 extracted by the IV characteristics extraction process 101, the IBIS output capacitance model 115 obtained by the output capacitance conversion process 104, and the IBIS-AC characteristics model 117 extracted by the AC characteristics (V-time table) extraction process 105 are synthesized to generate an IBIS simulation model 118. This IBIS simulation model 118 is an IBIS simulation model obtained according to the first exemplary embodiment.

Next, a simulation is executed on each of the circuits in FIGS. 9A and 9B used in the comparative examples, by using the IBIS simulation model obtained according to the first exemplary embodiment. The simulation results will be described as example 1.

In FIG. 10, the results of the simulation using the reference SPICE transistor model and the SPICE simulation tool, which are already described in the comparative examples, are overlaid with the results of the simulation using the IBIS simulation model obtained according to the first exemplary embodiment illustrated in FIG. 1 and using the tool A used in the IBIS simulation in a comparative example. As described above, the SPICE tool and the tool A are tools of the same type. In FIG. 10, thick lines represent the simulation results obtained by using the SPICE transistor model, and thin lines represent the simulation results obtained by using the IBIS simulation model extracted by the method according to the first exemplary embodiment (example 1). The results of both of the simulations approximately match each other.

Figure 12:
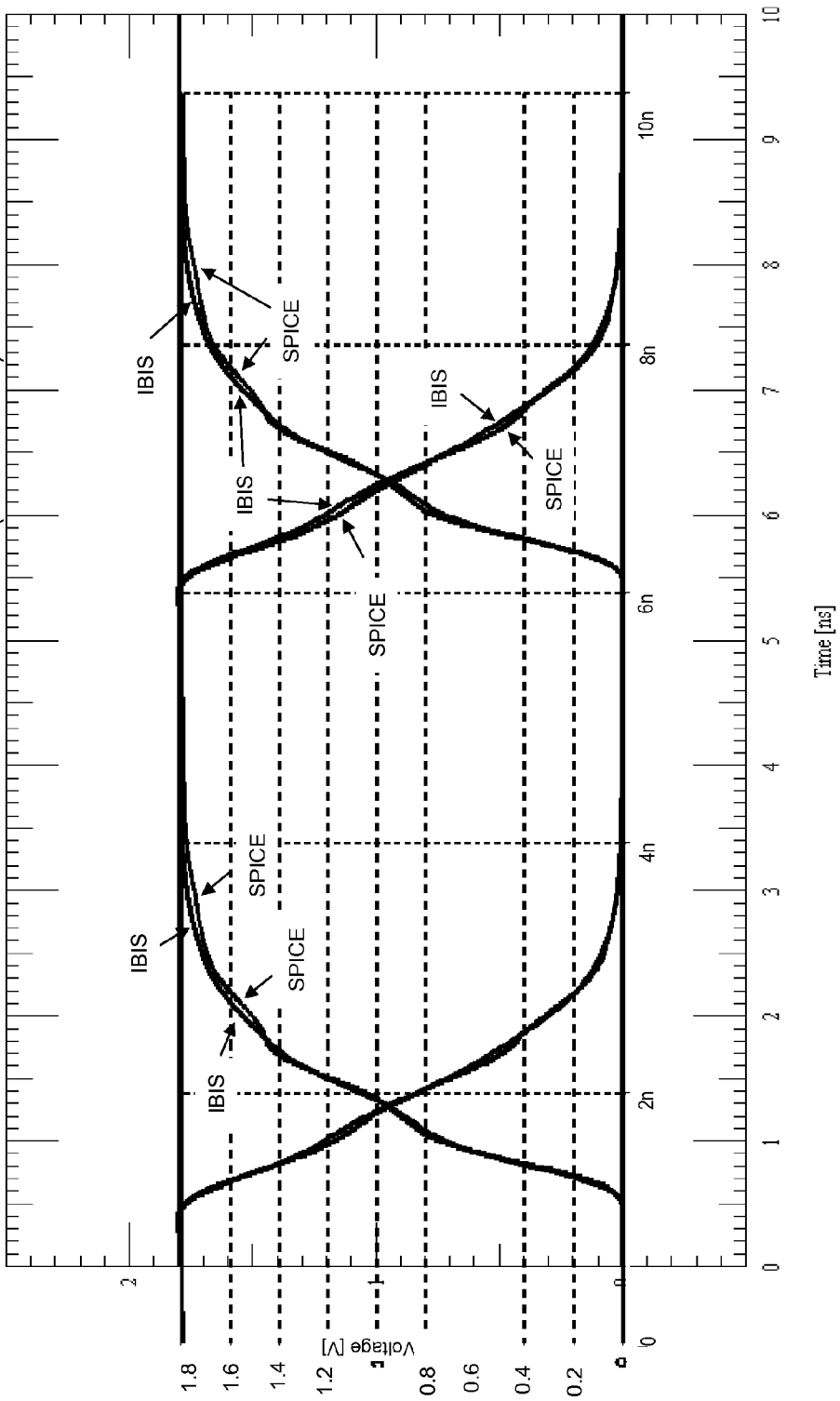

FIG. 11 illustrates results of a simulation executed using the same IBIS simulation model extracted by the method according to the first exemplary embodiment and using the IBIS simulation tool B that was also used in a comparative example, instead of the IBIS simulation tool A. In FIG. 12, the results of the simulation in FIG. 11 using the tool B are overlaid with the results of the simulation using the reference SPICE transistor model and using the SPICE simulation tool. The differences between the simulations are indicated by arrows to distinguish SPICE (the results of the transistor-level circuit simulation) and IBIS (the results of the simulation using the IBIS model extracted by the method according to the first exemplary embodiment (example 1)). Since there is no significant difference between the simulations, it is confirmed that accurate IBIS simulation results can be obtained according to the first exemplary embodiment.

Figure 13:
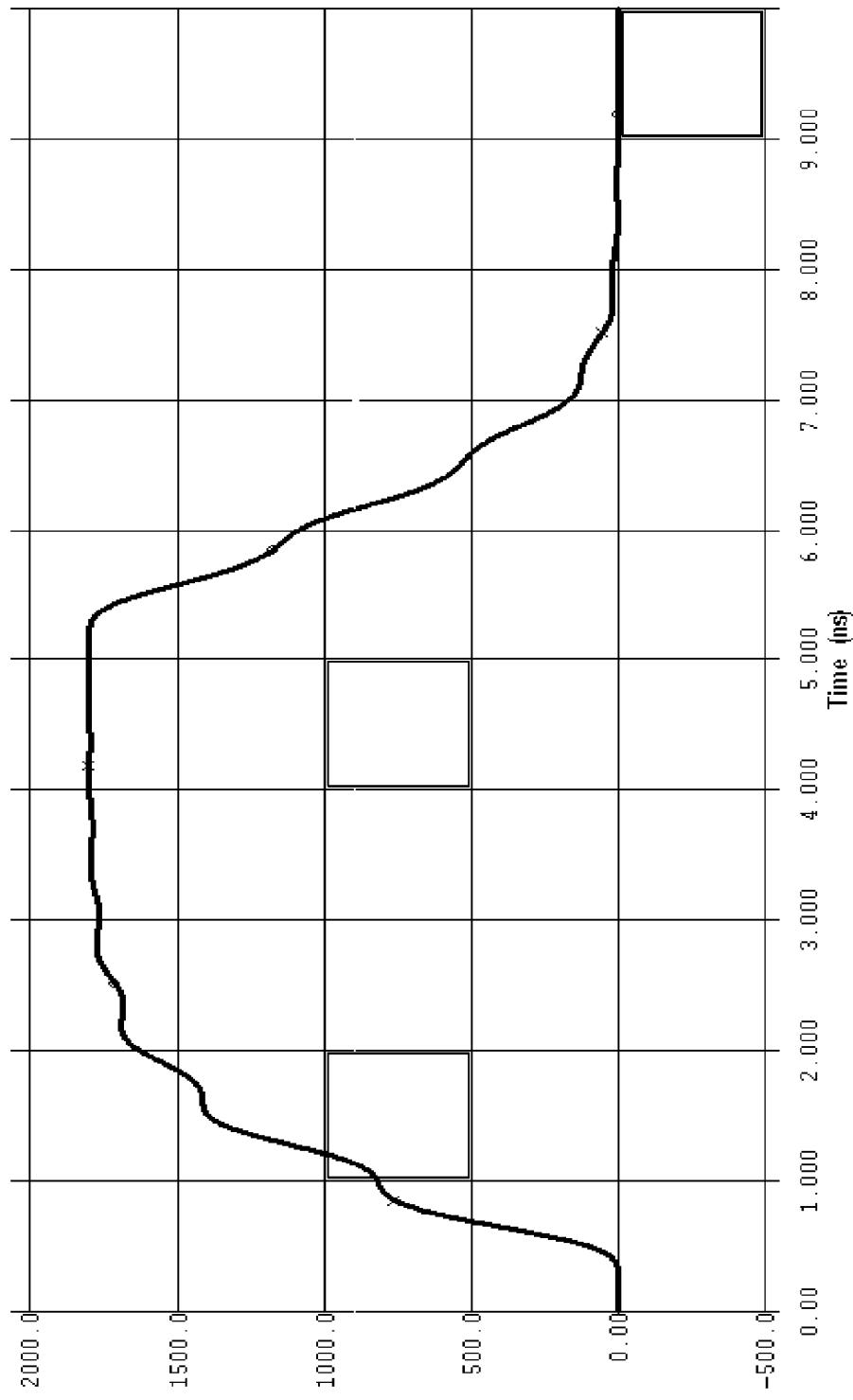
FIG. 13 illustrates results of a simulation using the same IBIS model extracted according to example 1 as used in FIG. 10 and using an IBIS simulation tool different from those used in FIGS. 10 and 11.
Figure 14:
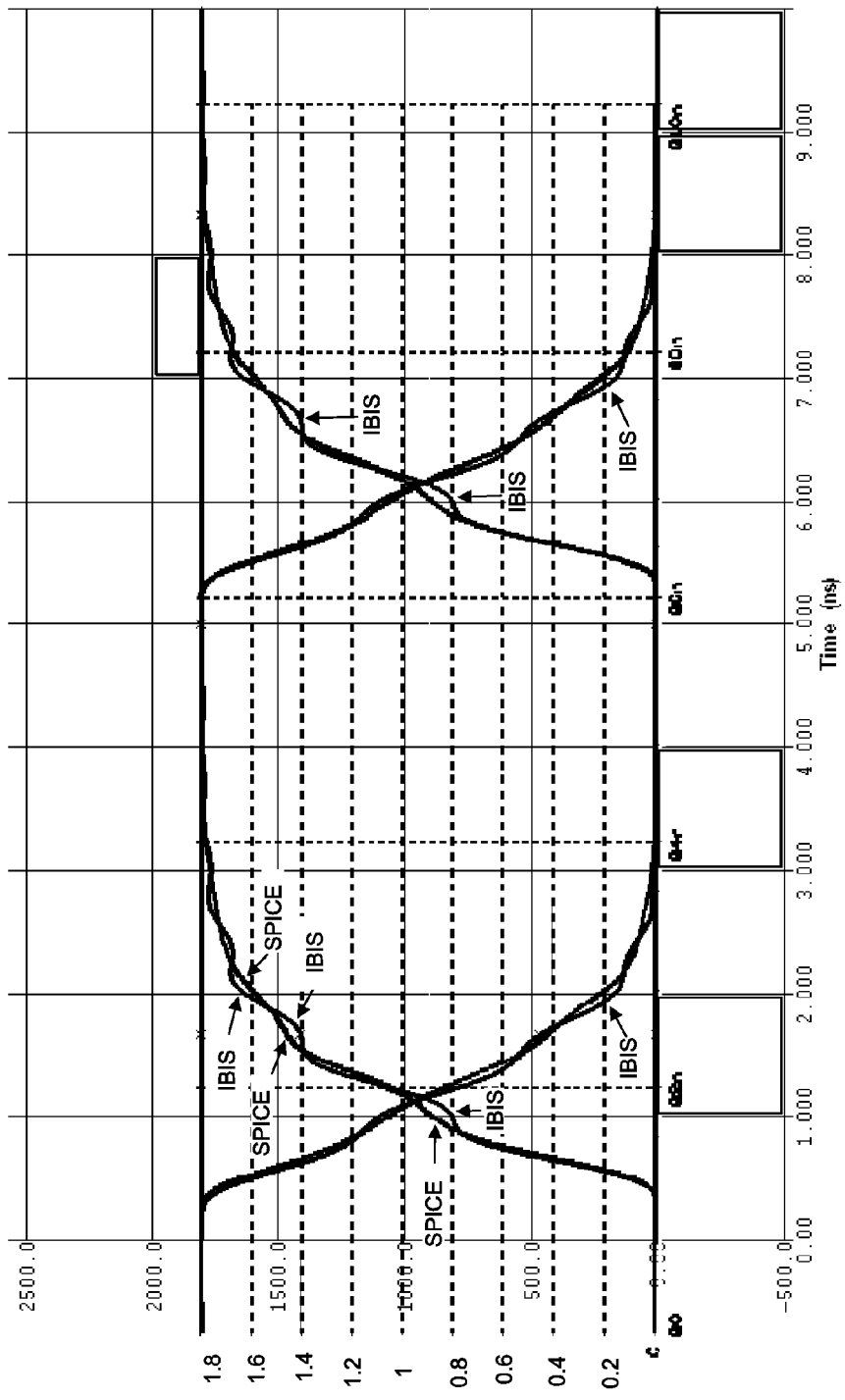

FIG. 13 illustrates results of a simulation executed using the same IBIS simulation model according to the first exemplary embodiment and using the IBIS simulation tool C that was also used in a comparative example. In FIG. 14, the results of the simulation in FIG. 13 using the tool C are overlaid with the results of the simulation using the reference SPICE transistor model and using the SPICE simulation tool. The differences between the simulations are indicated by arrows to distinguish SPICE (the results of the transistor-level circuit simulation) and IBIS (the results of the simulation using the IBIS model extracted by the method according to the first exemplary embodiment (example 1)). Since there is no significant difference between the simulations, it is confirmed that accurate IBIS simulation results can be obtained according to the first exemplary embodiment.

In FIG. 21, the results of the three simulations are compared: the results of the simulation (SPICE) using the reference SPICE transistor model and using the SPICE simulation tool; the results of the simulation (example 1) using the IBIS simulation model obtained by the method according to the first exemplary embodiment in FIG. 1 and using the tool A; and the results of the simulation (comparative example) using the IBIS simulation model obtained by the method according to comparative example 1 in FIG. 15 and the tool A. The differences among the simulation results are indicated by arrows. It is confirmed that, while the results of the simulation using the IBIS model according to the comparative example differ significantly from the results of the reference SPICE simulation using the SPICE transistor model, the results of the simulation using the IBIS model according to example 1 are approximately identical to the results of the reference SPICE simulation.

FIGS. 20A and 20B illustrate V-time tables (AC characteristics) extracted according to example 1 and a comparative example. In FIGS. 20A and 20B, under the rising and pull-up conditions (see FIG. 6A), time periods and output voltage values V in the time periods are indicated in table format. In addition, the following three conditions are set for the power-supply voltage, that is, TYP=1.8 V, min=1.7 V, and MAX=1.95 V.

The AC characteristics are extracted differently between the method according to the comparative example illustrated in FIG. 15 and the method according to the first exemplary embodiment (example 1) illustrated in FIG. 1. As can be seen from the comparison between FIGS. 20A and 20B, the rising time of example 1 is later than that of the comparative example. Namely, it is conceivable that the load capacitance of the output buffer remaining inactive, which is ignored in the comparative example, is attributable to the difference of the results.

[Variation of First Exemplary Embodiment]

Figure 22:
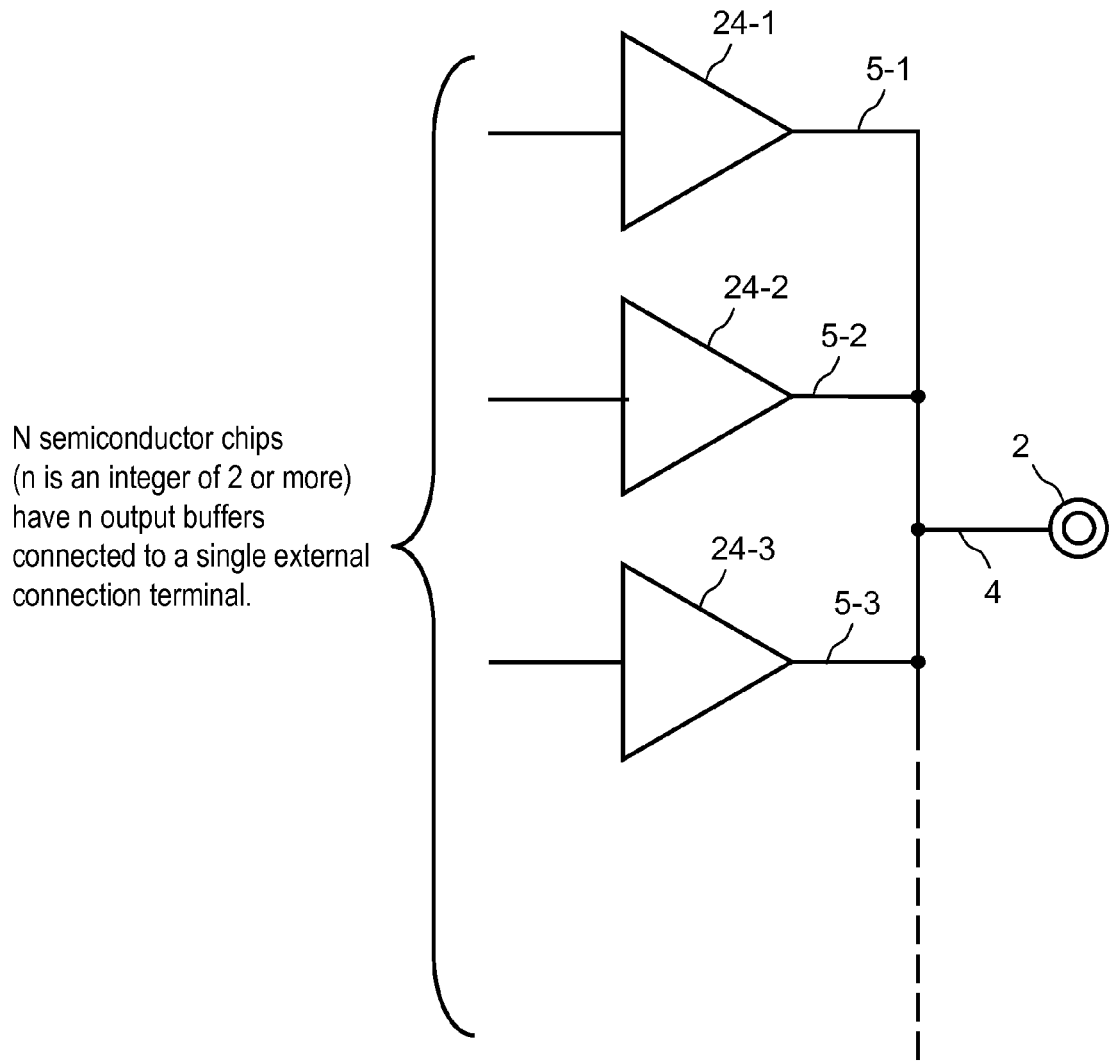
FIG. 22 illustrates a variation of the first exemplary embodiment.

The first exemplary embodiment has been described, assuming that a semiconductor device includes two semiconductor chips each having an output buffer connected to the external connection terminal 2. However, the present invention is not limited to such case where the number of output buffers connected to the external connection terminal 2 is 2. As illustrated in FIG. 22, n semiconductor chips (n is an integer of 2 or more) may have n output buffers connected to a single external connection terminal. In this case, only one output buffer is controlled to be active, and the other (n−1) output buffers are controlled to remain inactive. In addition, the wirings extending from the external connection terminal 2 toward the output buffers 24-1 to 24-n comprise branch wirings 5-1 to 5-n for respective output buffers and a common wiring 4. Based on the method according to the first exemplary embodiment, when the branch wirings 5-1 to 5-n are relatively short and have the same length, an IBIS simulation model can be extracted accurately. This is because, in this way, presence of the branch wirings in the IBIS simulation model can be ignored.

In addition, in the IV characteristics extraction process 101 in FIG. 1, when output transistors of the output buffers of the semiconductor chips, for which an IBIS model is extracted, form enhanced-type CMOS output buffers made of PMOS and NMOS output transistors, if an output voltage is within a power-supply voltage range, the method can extract IV characteristics while ignoring presence of the (n−1) inactive output buffers of the n output buffers. However, if the output voltage exceeds the power-supply voltage range and is clamped at a voltage outside the power-supply voltage, the method cannot ignore presence of the output buffers remaining inactive, to extract IV characteristics. For example, in FIG. 5A, when a PMOS output transistor 241 has the source connected to a power-supply voltage VDD (1.5 V) and an NMOS output transistor 242 has the source connected to a power-supply voltage VSS (0V), if the voltage at the external connection terminal 2 is clamped at a voltage less than 0 V or more than 1.5 V, a transistor-level circuit simulation is executed assuming that the n output buffers are connected in parallel. Namely, the IV characteristics extraction process 101 needs to be executed in view of presence of the output buffers remaining inactive. In this way, even if the external connection terminal 2 is clamped at a voltage outside a power-supply voltage range, an accurate IBIS simulation model can be extracted.

[Second Exemplary Embodiment]

An IBIS simulation model extraction method according to the first exemplary embodiment described with reference to FIG. 1, as illustrated in FIG. 1, can be executed by an IBIS simulation model extraction apparatus 100 including: an IV characteristics extraction unit 101 executing the IV characteristics extraction process; an output capacitance extraction unit 102 executing the output capacitance extraction process; a connection information synthesis unit 103 executing the connection information synthesis process; an output capacitance conversion unit 104 executing the output capacitance conversion process; an AC characteristics extraction unit 105 executing the AC characteristics extraction process; and an IBIS simulation model synthesis unit 106 executing the IBIS simulation model synthesis process. It is desirable that the IBIS simulation model extraction apparatus 100 include: a transistor-level circuit simulation model storage unit 111 (net list storage unit 111) storing, as a storage unit storing data, (transistor-level circuit simulation) connection information (transistor-level circuit simulation model); a transistor model storage unit 112 storing a circuit simulation transistor model; a synthesized connection information storage unit 113 (synthesized net list storage unit 113) storing synthesized connection information; a circuit simulation output capacitance storage unit 114 storing a (transistor-level) circuit simulation output capacitance model; an IBIS output capacitance storage unit 115 (output capacitance model intermediate data storage unit) storing an IBIS output capacitance model; an IBIS-IV characteristics model storage unit 116 storing an IBIS-IV characteristics model; an IBIS-IV characteristics model storage unit 117 (AC characteristics model intermediate data storage unit) storing an IBIS-AC characteristics model; and an IBIS simulation model storage unit 118 storing an IBIS simulation model.

In addition, irrespective of the description of the second exemplary embodiment, the IBIS simulation model extraction method according to the first exemplary embodiment executed in accordance with the procedure in FIG. 1 can of course be executed without using the IBIS simulation model extraction apparatus 100 according to the second exemplary embodiment. For example, in the connection information synthesis process 103 or the IBIS simulation model synthesis process 106, the synthesis may be executed by using text editor or the like. According to the second exemplary embodiment, these processes may be executed automatically.

[Third Exemplary Embodiment]

Figure 23:
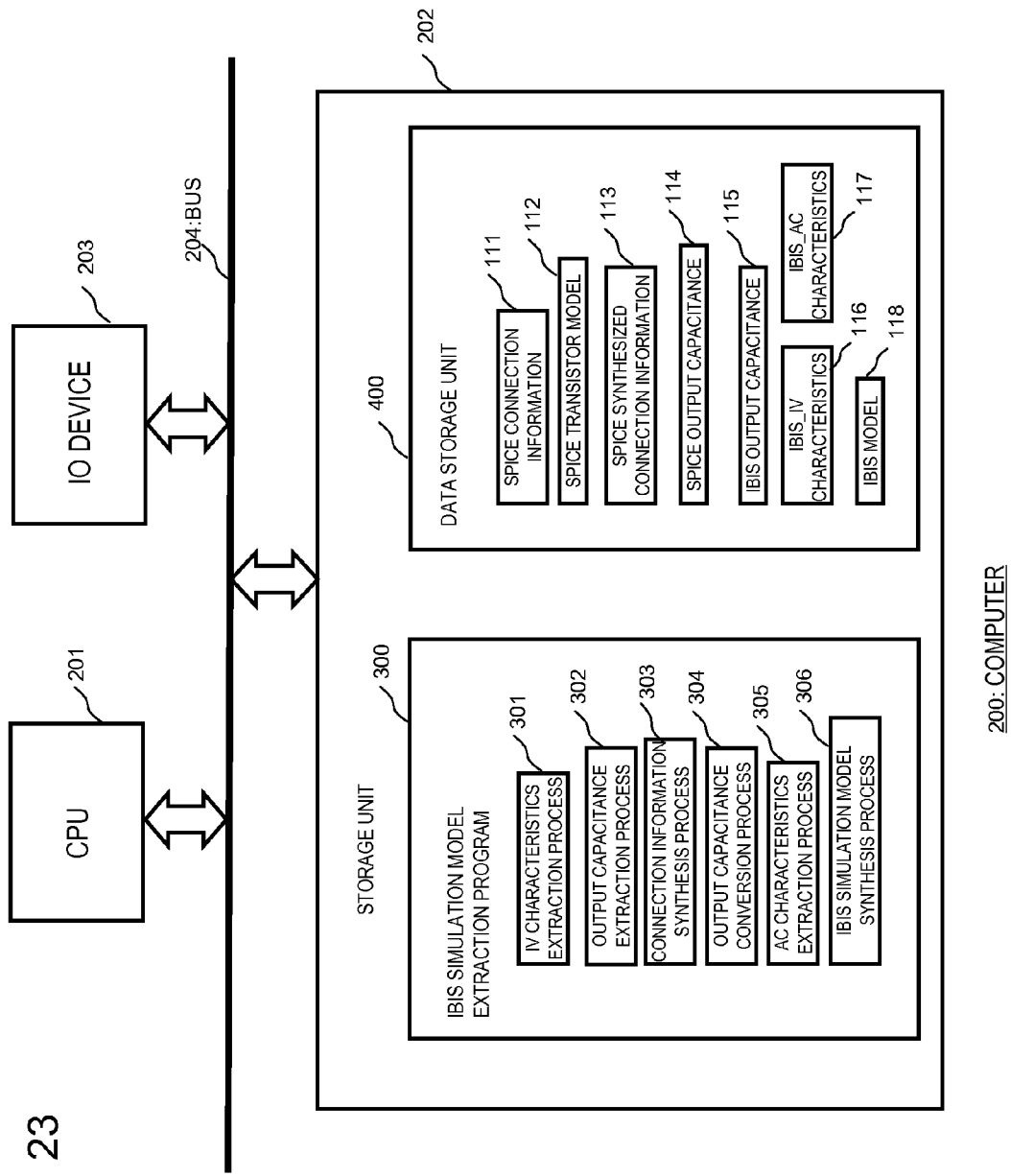
FIG. 23 is a block diagram illustrating a configuration according to a third exemplary embodiment in which a computer program for extracting an IBIS simulation model causes a computer to function as an IBIS simulation model extraction apparatus.

In addition, as illustrated in FIG. 23, in a computer 200, a CPU 201, an IO device 203, and a storage unit 202 are connected via a bus 204. By installing an IBIS simulation model extraction program 300 in the storage unit 202, a user can cause the computer 200 to function as the IBIS simulation model extraction apparatus 100 according to the second exemplary embodiment. Namely, the computer 200 can execute the IBIS simulation model extraction method according to the first exemplary embodiment.

The storage unit 202 includes an IBIS simulation model extraction program 300 and a data storage unit 400. The IBIS simulation model extraction program 300 includes: an IV characteristics extraction process program 301 causing the CPU 201 to function as the IV characteristics extraction unit 101 and to execute the IV characteristics extraction process 101; an output capacitance extraction process program 302 causing the CPU 201 to function as the output capacitance extraction unit 102 and to execute the output capacitance extraction process 102; and a connection information synthesis process program 303 causing the CPU 201 to function as the connection information synthesis unit 103 and to execute the connection information synthesis process 103. In addition, the IBIS simulation model extraction program 300 includes: an output capacitance conversion process program 304 causing the CPU 201 to function as the output capacitance conversion unit 104 and to execute the output capacitance conversion process 104; an AC characteristics extraction process program 305 causing the CPU 201 to function as the AC characteristics extraction unit 105 and to execute the AC characteristics extraction process 105; and an IBIS simulation model synthesis process program 306 causing the CPU 201 to function as the IBIS simulation model synthesis unit 106 and to execute the IBIS simulation model synthesis process 106.

The data storage unit 400 stores the SPICE connection information 111, the SPICE transistor model 112, the SPICE synthesized connection information 113, the SPICE output capacitance 114, the IBIS output capacitance 115, the IBIS_IV characteristics 116, the IBIS_AC characteristics 117, and the synthesized IBIS model 118, which are described with reference to FIG. 1. The storage unit 202 may be an arbitrary recording medium such as a random access memory (RAM), a cache memory, a hard disk, or an optical disk such as a CD or a DVD, as long as the storage unit 202 can be accessed by the CPU 201 and can function as a memory. In addition, part of the data storage unit 202 may be located at a distant place or be distributed at different places, as long as the storage unit 202 can be accessed by the CPU 201 through the Internet or the like. In addition, needless to say, a plurality of CPUs 201 may be present. Needless to say, all or part of the IBIS simulation model extraction apparatus 100 according to the second exemplary embodiment may be controlled by a means other than a computer, irrespective of the description of the third exemplary embodiment.

[Fourth Exemplary Embodiment]

The first exemplary embodiment has been described based on an example where the external connection terminal 2 is connected to a plurality of output buffers of a plurality of semiconductor chips having an identical transistor model and internal circuit configuration. However, the external connection terminal 2 may be connected to different types of the output buffers of different types of the n semiconductor chips (n is an integer of 2 or more). For example, if the semiconductor device is a semiconductor memory device, the semiconductor device may be a single package including a DRAM chip and a nonvolatile memory chip.

Figure 24:
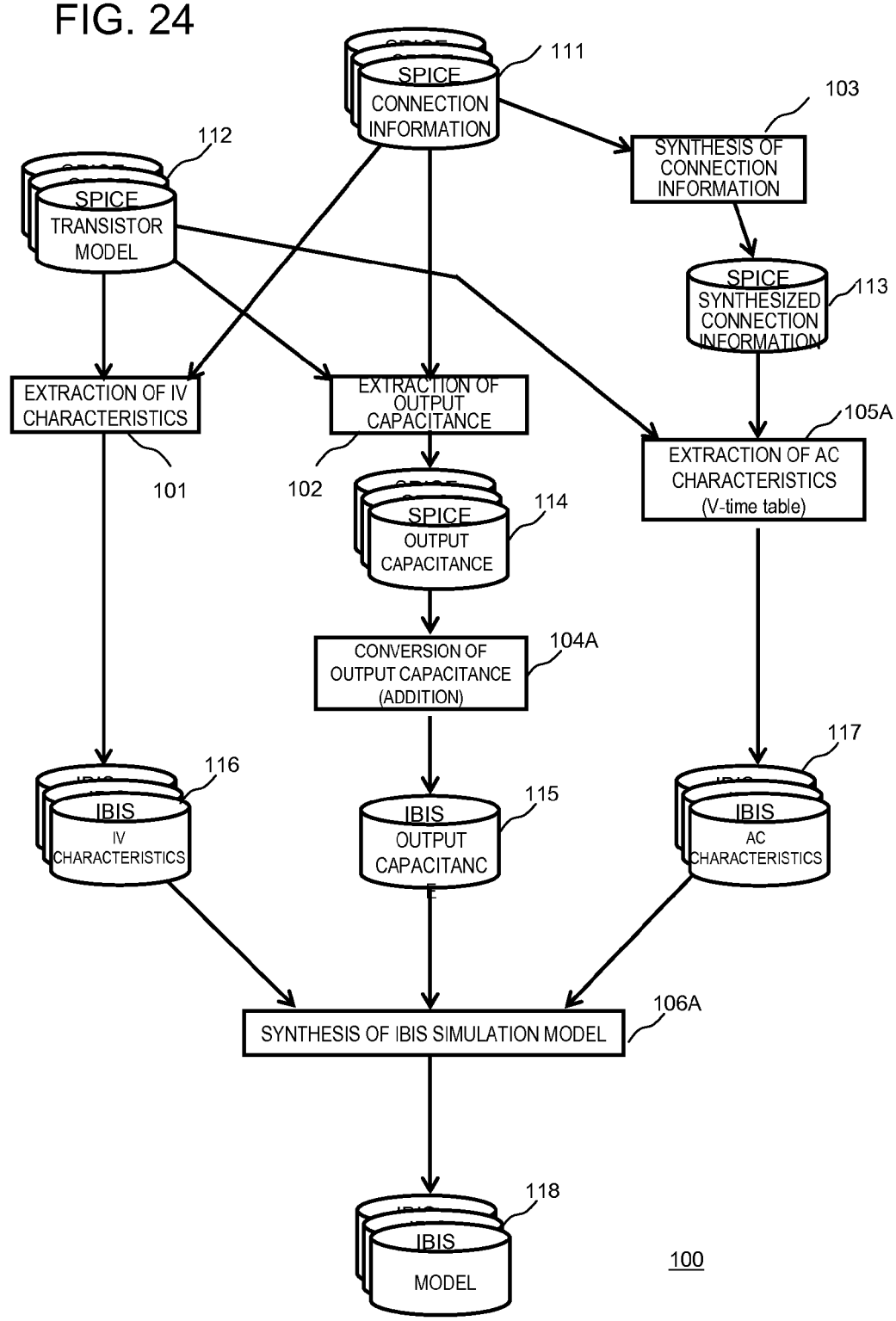
FIG. 24 is a flow chart illustrating a data/process flow of an IBIS simulation model extraction method according to a fourth exemplary embodiment.

FIG. 24 illustrates a method for extracting IBIS simulation models of such semiconductor device. If semiconductor chips have different transistor models, different types of transistor models 112 are prepared as transistor models. In addition, if the semiconductor chips have different output buffer structures or circuit configurations, the connection information 111 (including layout information such as transistor sizes) is prepared to match the number of the different types. In the IV characteristics extraction process 101, if a different transistor model 112 or different connection information 111 is used, different IV characteristics are obtained. Thus, the IV characteristics 116 are extracted and outputted for each of the different types. In the output capacitance extraction process 102, if a different transistor model 112 or different connection information 111 is used, the output capacitance 114 exhibits a different value. Thus, the output capacitance 114 is extracted each time a different transistor model 112 or different connection information 111 is used. In an output capacitance conversion process 104A, all the output capacitances of the n output buffers are added together and outputted as the IBIS output capacitance 115.

In the connection information synthesis process 103, the n output buffers are synthesized to generate synthesized connection information 113. AC characteristics (V-time tables) 117 are extracted by using both the synthesized connection information 113 and a plurality of transistor models 112 included in the synthesized connection information 113 and executing a transistor-level circuit simulation. If the n output buffers have different circuit configurations and use different transistor models, the AC characteristics 117 are obtained for each type of the active output buffers. Finally, in an IBIS simulation model synthesis process 106A, the IV characteristics 116, the output capacitance 115, and the AC characteristics 117 are synthesized to extract an IBIS model 118.

The extracted IBIS model 118 differs depending on a single output buffer activated among the n output buffers. Thus, a plurality of IBIS models 118 that match the number of the types are outputted. While the IV characteristics models 116 and the AC characteristics models 117 differ depending on the types of the output buffers, a single output capacitance model can be extracted irrespective of the types of the active output buffers.

According to the fourth exemplary embodiment, as in the other exemplary embodiments, it is preferable that the branch wirings 5 be short and have the same length. In this way, even if existence of the branch wirings 5 is ignored, accuracy of the IBIS model is not greatly affected. In addition, the IBIS simulation model extraction apparatus 100 according to the second exemplary embodiment and the IBIS simulation model extraction program 300 according to the third exemplary embodiment are applicable to the IBIS simulation model extraction method according to the fourth exemplary embodiment.

In addition, as described in the variation of the first exemplary embodiment, if an IBIS simulation is executed assuming that the external connection terminal 2 (see FIG. 5A) is clamped at a voltage outside a power-supply voltage, it is necessary to extract the IV characteristics by executing a transistor-level circuit simulation in a state where the n output buffers are connected to the external connection terminal 2 in parallel, as in extraction of the AC characteristics.

The above technical concept of the present invention is not limited to the circuit forms and generation methods disclosed by the examples. For example, in FIG. 2, the semiconductor chips 1 and 2 may be stacked separately on the package substrate 3. The technical concept of the present invention is applicable to a method for generating IBIS models of various semiconductor devices. For example, the present invention is applicable to generation of IBIS models of general semiconductor devices, including a central processing unit (CPU), a micro control unit (MCU), a digital signal processor (DSP), an application specific integrated circuit (ASIC), an application specific standard product (ASSP), and a memory. Examples of a product form of such semiconductor device to which the present invention is applicable include a system-on-chip (SOC), a multi-chip package (MCP), and a package-on-package (POP). The present invention is applicable to generation of an IBIS model of a semiconductor device having such arbitrary product form or package mode.

In addition, arbitrary field effect transistors (FETs) may be used. For example, various types of FETs such as metal oxide semiconductors (MOSs), metal-insulator semiconductors (MISs), and thin film transistors (TFT) are applicable. Further, the device may include a bipolar transistor.

In addition, an NMOS transistor (N-channel type MOS transistor) is a typical example of a first conductivity type transistor, and a PMOS transistor (P-channel type MOS transistor) is a typical example of a second conductivity type transistor.

The present invention is applicable to various fields using a semiconductor device incorporating a plurality of semiconductor chips having output buffers connected to a single external connection terminal. Namely, by using an IBIS simulation model extracted according to the present invention, the semiconductor device mounted on a substrate or a system can be simulated accurately. Thus, design quality of the substrate or system on which the semiconductor device is mounted can be improved.

The entire disclosure of the above Patent Document 1 is incorporated herein by reference thereto.

Modifications and adjustments of the exemplary embodiments and examples are possible within the scope of the overall disclosure (including the claims and the drawings) of the present invention and based on the basic technical concept of the invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the drawings and the technical concept.

What is claimed is:

1. A computer implemented method for extracting an Input/Output buffer information specification (IBIS) simulation model of a semiconductor device that comprises a first semiconductor chip including a first output buffer having an output node connected to a first pad and a second semiconductor chip including a second output buffer having an output node connected to a second pad, wherein the first and second pads are connected to a single external connection terminal, one of the first and second output buffers is controlled to be active, and the other is controlled to be inactive, the method comprising:
   extracting, using a computer, an AC characteristics model of the first output buffer in an IBIS simulation model by executing a transistor-level circuit simulation using a net list that includes output transistors of the first and second output buffers;
   calculating, using the computer, an output capacitance model of the first output buffer in the IBIS simulation model by adding output capacitances of the first and second output buffers of the net list together; and
   synthesizing, using the computer, an IBIS simulation model of the first output buffer viewed from the external connection terminal by using the AC characteristics model and the output capacitance model of the first output buffer.

2. The method for extracting an IBIS simulation model according to claim 1, further comprising:
   extracting a voltage-current (IV) characteristics model of the first output buffer in the IBIS simulation model by executing a transistor-level circuit simulation using the net list, wherein
   said synthesizing the IBIS simulation model of the first output buffer comprises using also the IV characteristics model of the first output buffer.

3. The method for extracting an IBIS simulation model according to claim 1, wherein:
   the first and second output buffers have substantially the same electrical characteristics when viewed from the external connection terminal; and
   said calculating the output capacitance model of the first output buffer in the IBIS simulation model comprises doubling the output capacitance of the first output buffer of the net list.

4. The method for extracting an IBIS simulation model according to claim 3, wherein:
   a wiring arranged from the external connection terminal to the first and second output buffers comprises a common wiring that extends from the external connection terminal toward the first and second output buffers, a first branch wiring that extends from the common wiring to the first output buffer, and a second branch wiring that extends from the common wiring to the second output buffer; and
   the first and second branch wirings have substantially the same length.

5. The method for extracting an IBIS simulation model according to claim 4, wherein:
   the semiconductor device further comprises a package substrate;
   the first and second semiconductor chips are stacked on the package substrate;
   the common wiring extends on the package substrate; and
   the first and second output buffers are connected to the external connection terminal via the common wiring arranged on the package substrate.

6. The method for extracting an IBIS simulation model according to claim 1, further comprising:
   extracting an AC characteristics model of the second output buffer in the IBIS simulation model by executing a transistor-level circuit simulation using the net list;
   calculating an output capacitance model of a second output buffer in the IBIS simulation model by adding output capacitances of the first and second output buffers of the net list together; and
   synthesizing an IBIS simulation model of the second output buffer viewed from the external connection terminal by using the AC characteristics model and the output capacitance model of the second output buffer.

7. The method for extracting an IBIS simulation model according to claim 6, further comprising:
   extracting a voltage-current (IV) characteristics model of the second output buffer in the IBIS simulation model by executing a transistor-level circuit simulation using the net list, wherein
   said synthesizing the IBIS simulation model of the second output buffer comprises using also the IV characteristics model of the second output buffer.

8. The method for extracting an IBIS simulation model according to claim 1, wherein:
   both the first and second semiconductor chips are a memory chip; and
   the external connection terminal is a data input/output terminal.

9. The method for extracting an IBIS simulation model according to claim 1, the method comprising:
   using an IBIS simulation model extraction apparatus that comprises a transistor-level circuit simulation model storage unit that stores transistor-level circuit simulation models of the first and second semiconductor chips comprising, respectively, the first and second output buffers, a transistor-level circuit simulation execution unit, an AC characteristics model intermediate data storage unit, an output capacitance model intermediate data storage unit, and a synthesis unit, wherein:

said extracting an AC characteristics model of the first output buffer comprises executing by the transistor-level circuit simulation execution unit a transistor-level circuit simulation using a net list stored in the transistor-level circuit simulation model storage unit, and storing the extracted AC characteristics model of the first output buffer in the AC characteristics model intermediate data storage unit;

said calculating the output capacitance model of the first output buffer comprises adding output capacitances of the first and second output buffers stored in the transistor-level circuit simulation model storage unit, and storing the calculated output capacitance model of the first output buffer in the IBIS simulation model in the output capacitance model intermediate data storage unit; and said synthesizing the IBIS simulation model of the first output buffer comprises the synthesis unit using the AC characteristics model of the first output buffer stored in the AC characteristics model intermediate data storage unit and the output capacitance model of the first output buffer stored in the output capacitance model intermediate data storage unit to synthesize the IBIS simulation model.

10. The method for extracting an IBIS simulation model according to claim 9, wherein:

said IBIS simulation model extraction apparatus further comprises a transistor model storage unit that stores a transistor model, and a synthesized connection information storage unit that stores synthesized connection information in which connection information about the first and second output buffers is synthesized;

said transistor-level circuit simulation execution unit comprises a connection information synthesis unit that synthesizes, before extracting the AC characteristics model of the first output buffer, connection information of the first and second output buffers to obtain the synthesized connection information, based on connection information about the first and second output buffers stored in the transistor-level circuit simulation model storage unit; and said extracting the AC characteristics model comprises using synthesized connection information stored in the synthesized connection information storage unit and a transistor model stored in the transistor model storage unit.

11. The method for extracting an IBIS simulation model according to claim 9, wherein by storing in a program storage unit of a computer a program that extracts the IBIS simulation model and causes the computer to execute the program, the computer is caused to function as the IBIS simulation model extraction apparatus.

12. A computer implemented method for extracting an Input/Output buffer information specification (IBIS) simulation model of a semiconductor device, said semiconductor device comprising an external connection terminal and n, where n is an integer of two or more, semiconductor chips, each including an output buffer having an output node connected to the external connection terminal, wherein one of the n output buffers connected to the external connection terminal is controlled to be active, and the other (n−1) output buffers are controlled to remain inactive, the method comprising:

extracting, using a computer, an AC characteristics model of the one output buffer in an IBIS simulation model, by executing a transistor-level circuit simulation using a net list that comprises information about the n output buffers connected to the external connection terminal and controlled to be active and inactive;

calculating, using the computer, an output capacitance model of the one output buffer in the IBIS simulation model by adding output capacitances of the n output buffers of the net list; and synthesizing, using the computer, an IBIS simulation model of the one output buffer viewed from the external connection terminal by using the AC characteristics model and the output capacitance model.

13. The method for extracting an IBIS simulation model according to claim 12, wherein said net list comprises:

properties of a plurality of output transistors included in each of the n output buffers; and connection information about the output transistors.

14. The method for extracting an IBIS simulation model according to claim 12, wherein:

said n output buffers have the same electrical characteristics; and said calculating the output capacitance model of the one output buffer in the IBIS simulation model comprises multiplying by n an output capacitance of the one output buffer in a transistor-level circuit simulation model.

15. The method for extracting an IBIS simulation model according to claim 12, wherein:

a wiring arranged from the external connection terminal to the n output buffers comprises a common wiring extending from the external connection terminal toward the n output buffers, and n branch wirings extending from the common wiring to the n output buffers, respectively; and said n branch wirings have substantially the same length.

16. The method for extracting an IBIS simulation model according to claim 15, wherein:

said semiconductor device further comprises a package substrate;

said n semiconductor chips are stacked on the package substrate, an insulator being stacked between each two of the n semiconductor chips and between one of the n semiconductor chips and the package substrate;

said common wiring is arranged on the package substrate; and said n output buffers arranged in the n semiconductor chips are connected to the external connection terminal via the common wiring arranged on the package substrate.

17. The method for extracting an IBIS simulation model according to claim 12, wherein:

each of the n semiconductor chips comprises a memory chip; and said external connection terminal comprises a data output terminal that outputs data stored in the memory chips.

18. The method for extracting an IBIS simulation model according to claim 12, further comprising:

repeating n times the extracting of the AC characteristics model of the one output buffer to extract a plurality of AC characteristics models of the n output buffers in the IBIS simulation model;

treating the output capacitance model of the one output buffer in the IBIS simulation model as an output capacitance model of each of the n output buffers; and synthesizing a plurality of IBIS simulation models of the n output buffers viewed from the external connection terminal by using the plurality of AC characteristics models and the output capacitance model.

\* \* \* \* \*